(12) United States Patent
Hsu et al.

(10) Patent No.: US 11,301,176 B2
(45) Date of Patent: Apr. 12, 2022

(54) MICROCONTROLLER ARCHITECTURE FOR NON-VOLATILE MEMORY

(71) Applicant: SanDisk Technologies LLC, Addison, TX (US)

(72) Inventors: Chi-Lin Hsu, San Jose, CA (US);
Tai-Yuan Tseng, Milpitas, CA (US);
Yan Li, Milpitas, CA (US); Hiroyuki Mizukoshi, Kawasaki (JP)

(73) Assignee: SanDisk Technologies LLC, Addison, TX (US)

( * ) Notice: Subject to any disclaimer, the term of this patent is extended or adjusted under 35 U.S.C. 154(b) by 9 days.

(21) Appl. No.: 16/909,484

(22) Filed: Jun. 23, 2020

(65) Prior Publication Data

US 2020/0356311 A1    Nov. 12, 2020

Related U.S. Application Data

(62) Division of application No. 15/994,116, filed on May 31, 2018, now Pat. No. 10,824,376.

(Continued)

(51) Int. Cl.
*G06F 3/06* (2006.01)
*G06F 9/30* (2018.01)
(Continued)

(52) U.S. Cl.
CPC .............. *G06F 3/0679* (2013.01); *G06F 8/65* (2013.01); *G06F 9/3004* (2013.01);
(Continued)

(58) Field of Classification Search
CPC .. G06F 2212/2022; G06F 3/0679; G06F 8/65; G06F 9/3004; G06F 9/30185;
(Continued)

(56) References Cited

U.S. PATENT DOCUMENTS 5,509,134 A    4/1996  Fandrich et al.
6,345,348 B2   2/2002  Watanabe et al.
(Continued)

FOREIGN PATENT DOCUMENTS

EP    2211271 A2    7/2010

OTHER PUBLICATIONS

Intel, "Max 10 User Flash Memory User Guide," UG-M10UFM, Feb. 21, 2017, 29 pages.

(Continued)

*Primary Examiner* — Zhuo H Liz
(74) *Attorney, Agent, or Firm* — Vierra Magen Marcus LLP

(57) ABSTRACT

A non-volatile memory system comprises a memory structure and a control circuit connected to the memory structure. The control circuit includes a programmable and reprogrammable microcontroller. The microcontroller has a first processor that executes instructions to coordinate sequences of voltages applied to the memory structure by a first circuit in order to perform memory operations. The microcontroller has a second processor that executes second instructions to control a second circuit to test conditions of the non-volatile memory cells in response to the voltages applied to the memory structure. The microcontroller may have a third processor that controls the flow of the memory operation and directs the first and second processors to execute the instructions. The instructions of the various processors may be updated, which provides for flexible flow, core operation control, and condition testing.

18 Claims, 18 Drawing Sheets

Related U.S. Application Data

(60) Provisional application No. 62/596,518, filed on Dec. 8, 2017.

(51) Int. Cl.

| | | |
|---|---|---|
| *G06F 9/38* | (2018.01) |
| *G11C 11/00* | (2006.01) |
| *G11C 5/06* | (2006.01) |
| *G11C 11/4072* | (2006.01) |
| *G06F 8/65* | (2018.01) |
| *G11C 29/16* | (2006.01) |
| *G11C 5/14* | (2006.01) |
| *G11C 16/28* | (2006.01) |
| *G11C 11/56* | (2006.01) |
| *G11C 29/46* | (2006.01) |
| *G11C 16/34* | (2006.01) |
| *G11C 16/24* | (2006.01) |
| *G11C 16/10* | (2006.01) |
| *G11C 16/08* | (2006.01) |

(52) U.S. Cl.
CPC ........ *G06F 9/30185* (2013.01); *G06F 9/3879* (2013.01); *G11C 5/063* (2013.01); *G11C 5/145* (2013.01); *G11C 11/005* (2013.01); *G11C 11/4072* (2013.01); *G11C 11/5628* (2013.01); *G11C 11/5642* (2013.01); *G11C 16/08* (2013.01); *G11C 16/10* (2013.01); *G11C 16/24* (2013.01); *G11C 16/28* (2013.01); *G11C 16/349* (2013.01); *G11C 16/3459* (2013.01); *G11C 29/16* (2013.01); *G11C 29/46* (2013.01); *G06F 2212/2022* (2013.01); *G11C 2211/5634* (2013.01)

(58) Field of Classification Search
CPC . G06F 9/3879; G11C 11/005; G11C 11/4072; G11C 11/5628; G11C 11/5642; G11C 16/08; G11C 16/10; G11C 16/24; G11C 16/28; G11C 16/3459; G11C 16/349; G11C 2211/5634; G11C 29/16; G11C 29/46; G11C 5/063
See application file for complete search history.

(56) References Cited

U.S. PATENT DOCUMENTS

| | | |
|---|---|---|
| 6,393,561 B1 | 5/2002 | Hagiwara et al. |
| 6,545,891 B1 | 4/2003 | Tringali et al. |
| 6,715,090 B1 | 3/2004 | Totsuka et al. |
| 6,721,843 B1 | 4/2004 | Estakhri |
| 6,754,765 B1 | 6/2004 | Chang et al. |
| 6,754,828 B1 | 6/2004 | Marisetty et al. |
| 6,765,813 B2 | 7/2004 | Scheuerlein et al. |
| 6,772,276 B2 | 8/2004 | Dover |
| 7,574,611 B2 | 8/2009 | Cohen |
| 7,594,055 B2 | 9/2009 | Gower et al. |
| 7,600,090 B2 | 10/2009 | Cohen et al. |
| 7,620,784 B2 | 11/2009 | Panabaker |
| 7,676,640 B2 | 3/2010 | Chow et al. |
| 7,788,553 B2 | 8/2010 | Chow et al. |
| 8,074,022 B2 | 12/2011 | Okin et al. |
| 8,131,915 B1 | 3/2012 | Yang |
| 8,327,161 B2 | 12/2012 | Cohen |
| 8,683,149 B2 | 3/2014 | Ware et al. |
| 8,843,731 B2 | 9/2014 | Bueb et al. |
| 9,116,620 B2 | 8/2015 | Lassa et al. |
| 9,583,220 B2 | 2/2017 | Tsai et al. |
| 9,600,191 B2 | 3/2017 | Pawlowski |
| 9,858,242 B2 | 1/2018 | Palmer et al. |
| 2009/0083476 A1 | 3/2009 | Pua et al. |
| 2010/0122097 A1 | 5/2010 | Cohen |
| 2012/0020155 A1 | 1/2012 | Kim |
| 2016/0300609 A1 | 10/2016 | Han et al. |
| 2016/0343454 A1 | 11/2016 | Pachamuthu et al. |
| 2017/0315813 A1 | 11/2017 | Smith et al. |
| 2019/0179573 A1 | 6/2019 | Hsu et al. |
| 2020/0341691 A1* | 10/2020 | Hsu ........................ G11C 16/10 |

OTHER PUBLICATIONS

Intel, "AN 741: Remote System Upgrade for Max 10 FPGA Devices over UART with the Nios II Processor," AN-741, Feb. 21, 2017, 15 pages.
Restriction Requirement dated Aug. 1, 2019, U.S. Appl. No. 15/994,116, filed May 31, 2018.
Response to Restriction Requirement dated Sep. 26, 2019, U.S. Appl. No. 15/994,116, filed May 31, 2018.
Non-Final Office Action dated Oct. 31, 2019, U.S. Appl. No. 15/994,116, filed May 31, 2018.
Response to Office Action dated Dec. 20, 2019, U.S. Appl. No. 15/994,116, filed May 31, 2018.
Final Office Action dated Mar. 18, 2020, U.S. Appl. No. 15/994,116, filed May 31, 2018.
Response to Office Action dated May 14, 2020, U.S. Appl. No. 15/994,116, filed May 31, 2018.
U.S. Appl. No. 16/909,467, filed Jun. 23, 2020.
Notice of Allowance dated Jul. 6, 2020, U.S. Appl. No. 15/994,116, filed May 31, 2018.
First Action Interview Pilot Program Pre-Interview Communication dated Sep. 21, 2021, U.S. Appl. No. 16/909,467, filed Jun. 23, 2020.
Notice of Allowance dated Jan. 21, 2022, U.S. Appl. No. 16/909,467, filed Jun. 23, 2020.

* cited by examiner

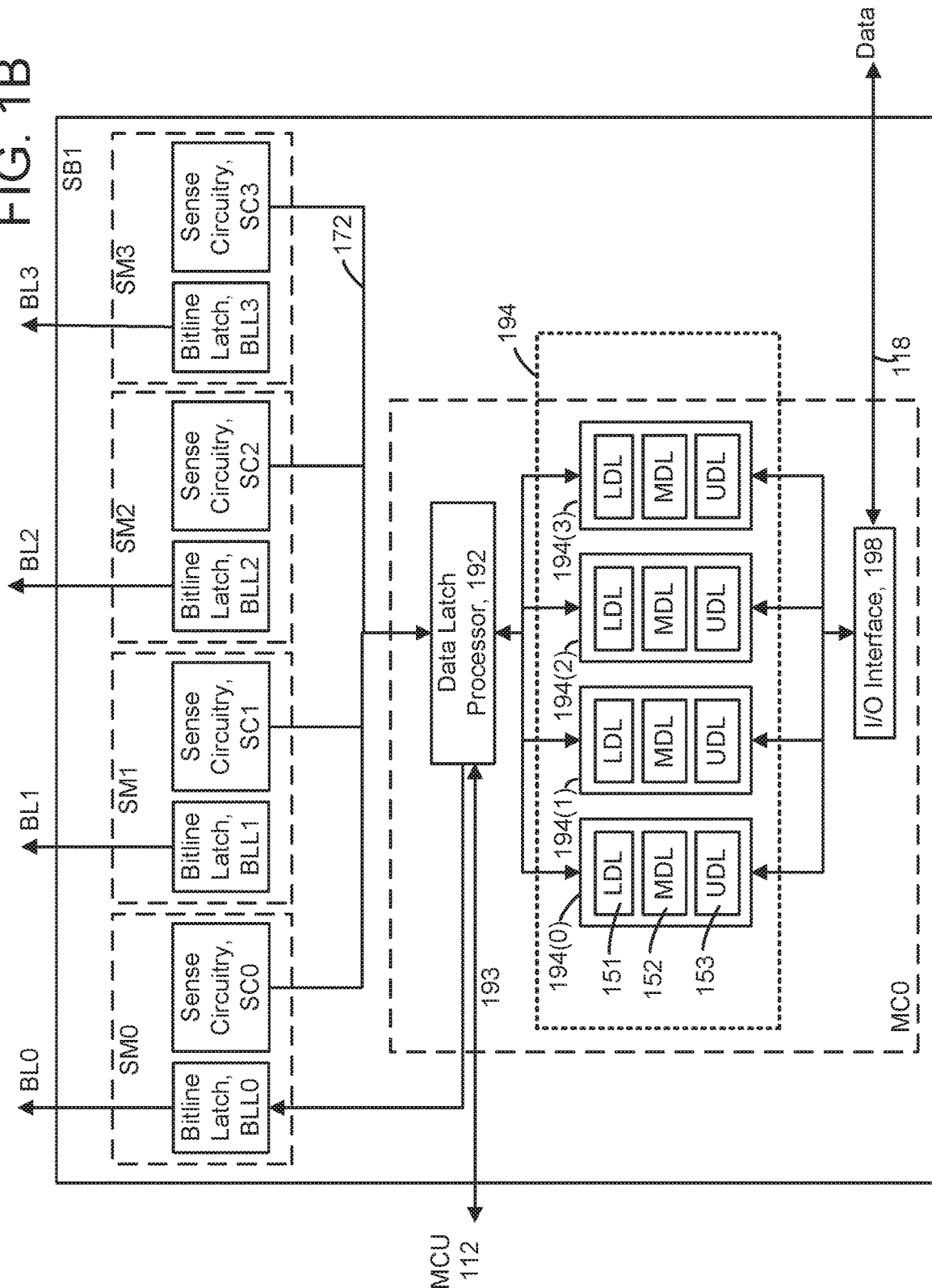

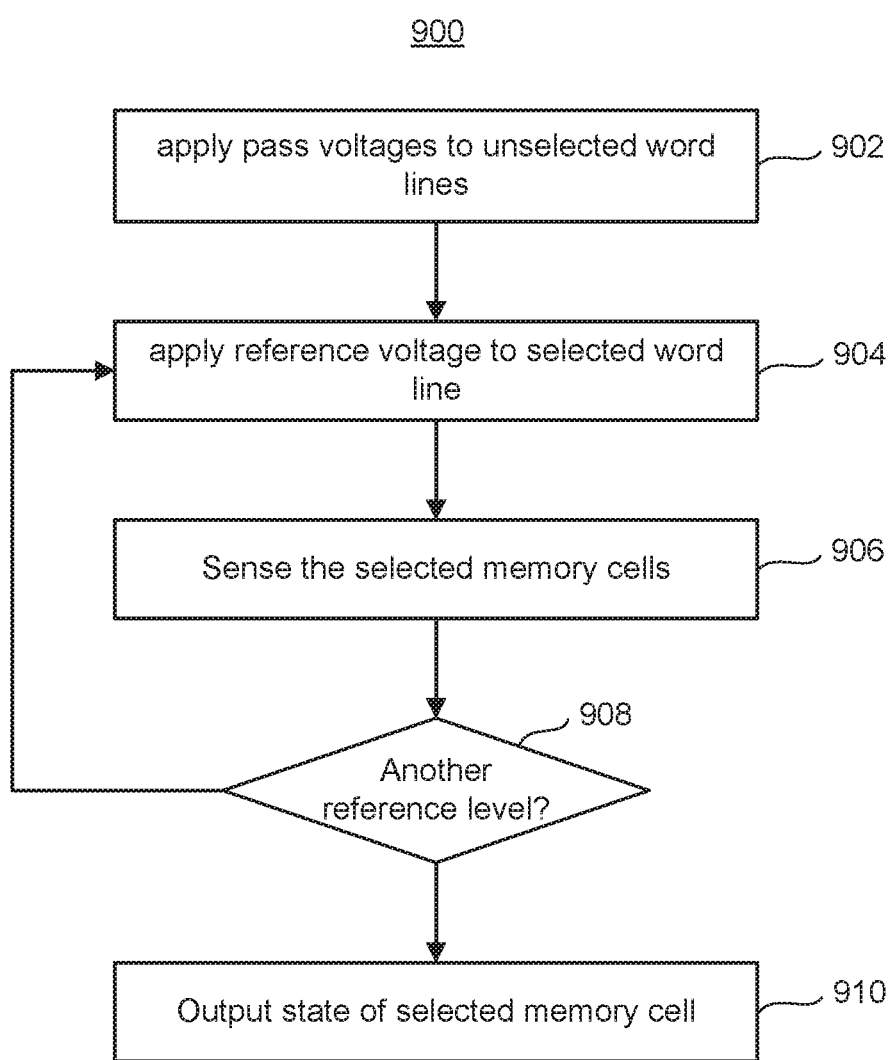

MICROCONTROLLER ARCHITECTURE FOR NON-VOLATILE MEMORY

CLAIM OF PRIORITY

The present application is a divisional application of U.S. patent application Ser. No. 15/994,116, entitled "MICROCONTROLLER ARCHITECTURE FOR NON-VOLATILE MEMORY," filed May 31, 2018, published as US 2019/0179573 on Jun. 13, 2019 and issued as U.S. Pat. No. 10,824,376 on Nov. 3, 2020, which claims priority to U.S. Provisional Application No. 62/596,518, entitled "MICROCONTROLLER ARCHITECTURE FOR NON-VOLATILE MEMORY," filed Dec. 8, 2017, both of which are herein incorporated by reference in their entirety.

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery).

BRIEF DESCRIPTION OF THE DRAWINGS

Like-numbered elements refer to common components in the different figures.

FIG. 1B is a block diagram depicting one embodiment of the sense block SB1 of FIG. 1A.

FIG. 9 is a flowchart of an embodiment of process 900 for sensing memory cells.

DETAILED DESCRIPTION

Figure 1:
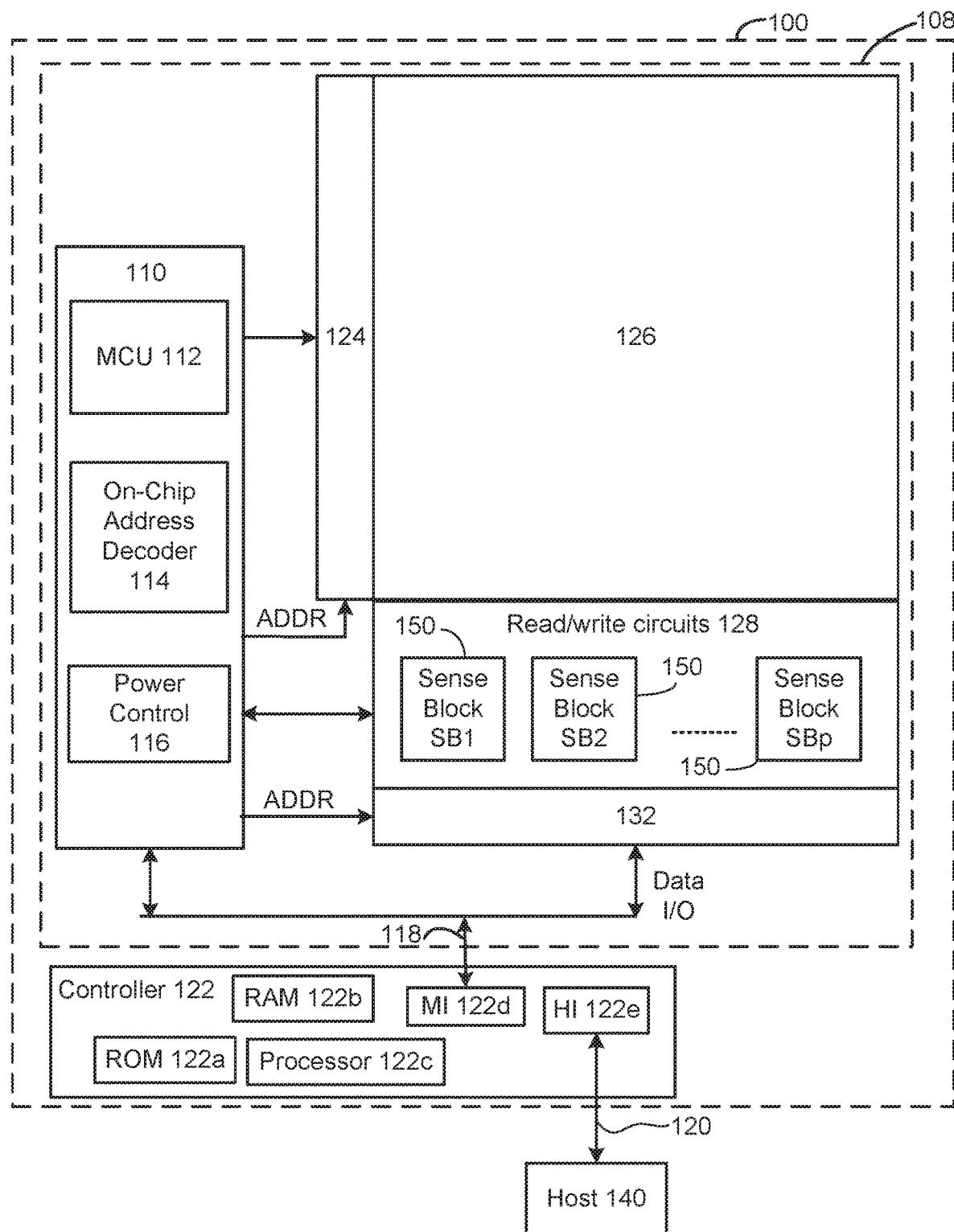
FIG. 1 is a functional block diagram of a memory device.

A proposed non-volatile memory system comprises a memory structure and a control circuit connected to the memory structure. The memory structure includes one or more planes of non-volatile memory cells. The control circuit may include a programmable and reprogrammable microcontroller.

One embodiment includes an apparatus, comprising a memory structure, a first processor, and a second processor. The first processor is configured to execute first instructions to coordinate sequences of voltages applied to the memory structure by a first circuit in order to perform memory operations with respect to non-volatile memory cells in the memory structure. The first processor is referred to as a "Core Processor," in one embodiment. The second processor is configured to execute second instructions in response to a trigger signal from the first processor to control a second circuit to test conditions of the non-volatile memory cells, in one embodiment. Thus, the second processor may control the second circuit to test conditions of the non-volatile memory cells in response to the voltages applied to the memory structure. The second processor is referred to as a "Sense Processor," in one embodiment.

One embodiment of the apparatus includes a third processor that is configured to direct the first processor to execute a first set of the first instructions to coordinate sequences of voltages applied to the memory structure by the first circuit for a particular memory operation. The third processor is configured to direct the second processor to execute a second set of the second instructions to control the second circuit to test a condition of a group of the non-volatile memory cells for the particular memory operation. The third processor is referred to as a "Main Processor," in one embodiment.

Each of the processors has access to storage, which contains instructions that can be executed by the processor. The instructions can be modified (for example during chip production and development) by replacing the instructions in the storage, which provides great flexibility. Thus, updates and/or design changes can be made with firmware updates rather than hardware or circuit changes. Also, less hardware is needed for testing the architecture, which means the size of the design can be smaller. Thus, design changes are much more flexible compared to, for example, an architecture in which a hard-wired state machine is used instead of the processors. The voltage waveforms and timing controlled by the Core Processor are modifiable after tape out without new hardware or circuit designs, in one embodiment. Likewise, conditions tested for by the Sense Processor are modifiable without new hardware or circuit designs, in one embodiment. Also, the algorithm run by the Main Processor which controls the execution of the memory operation is modifiable without new hardware or circuit designs, in one embodiment.

The processors in one embodiment of the microcontroller may execute in parallel, which is more efficient and reduces overhead. For example, during program or read operations, each of the processors may have different functions. The Core Processor and the Sense Processor may each have their own instruction queues. The Main Processor may place addresses or other identifiers of instructions on the instruction queues in order to control which instructions the Core and Sense Processors execute. Therefore, the Main Processor may act as a master.

Figure 2:
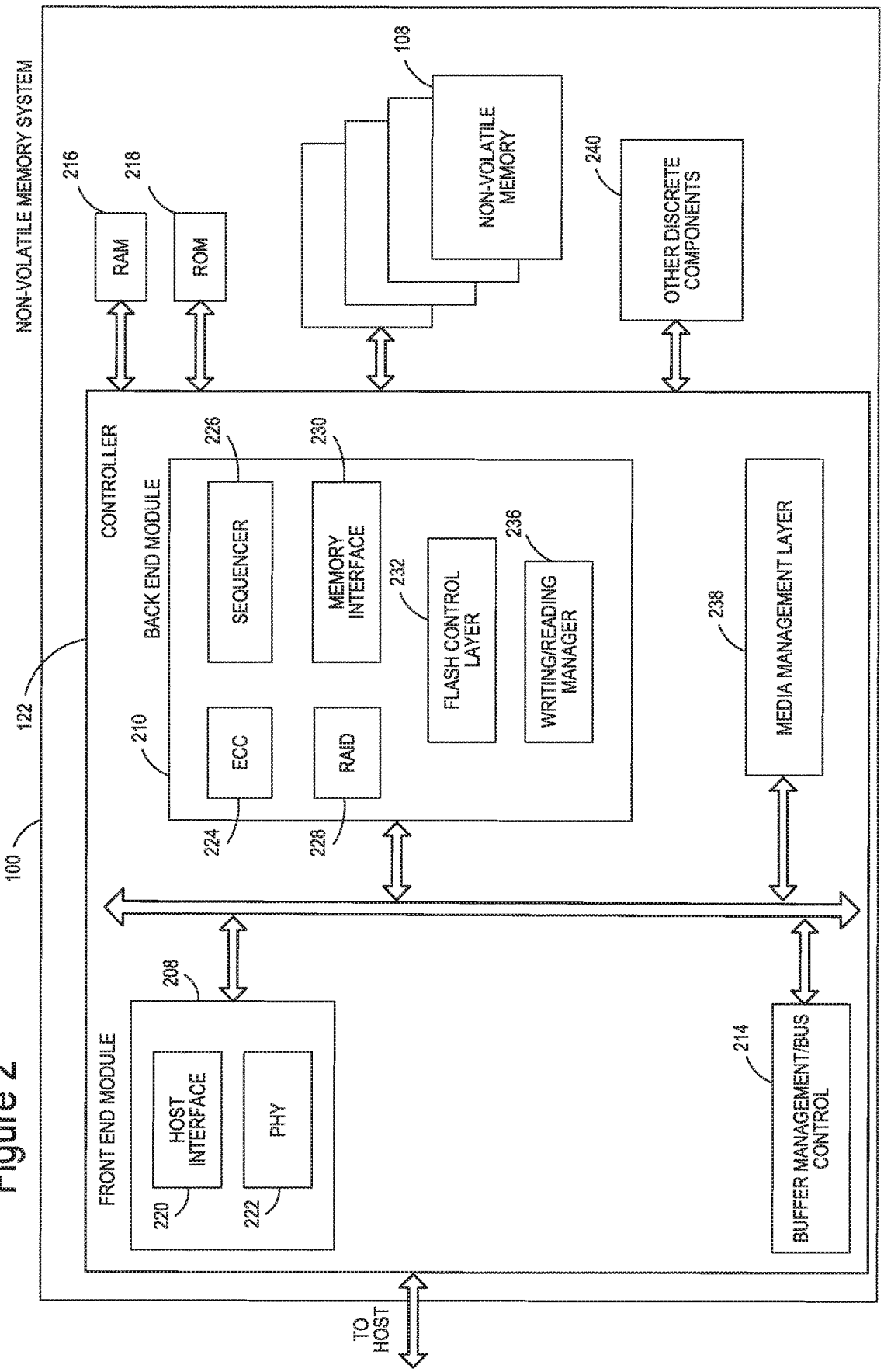
FIG. 2 is a block diagram depicting one embodiment of a memory system.
Figure 3:
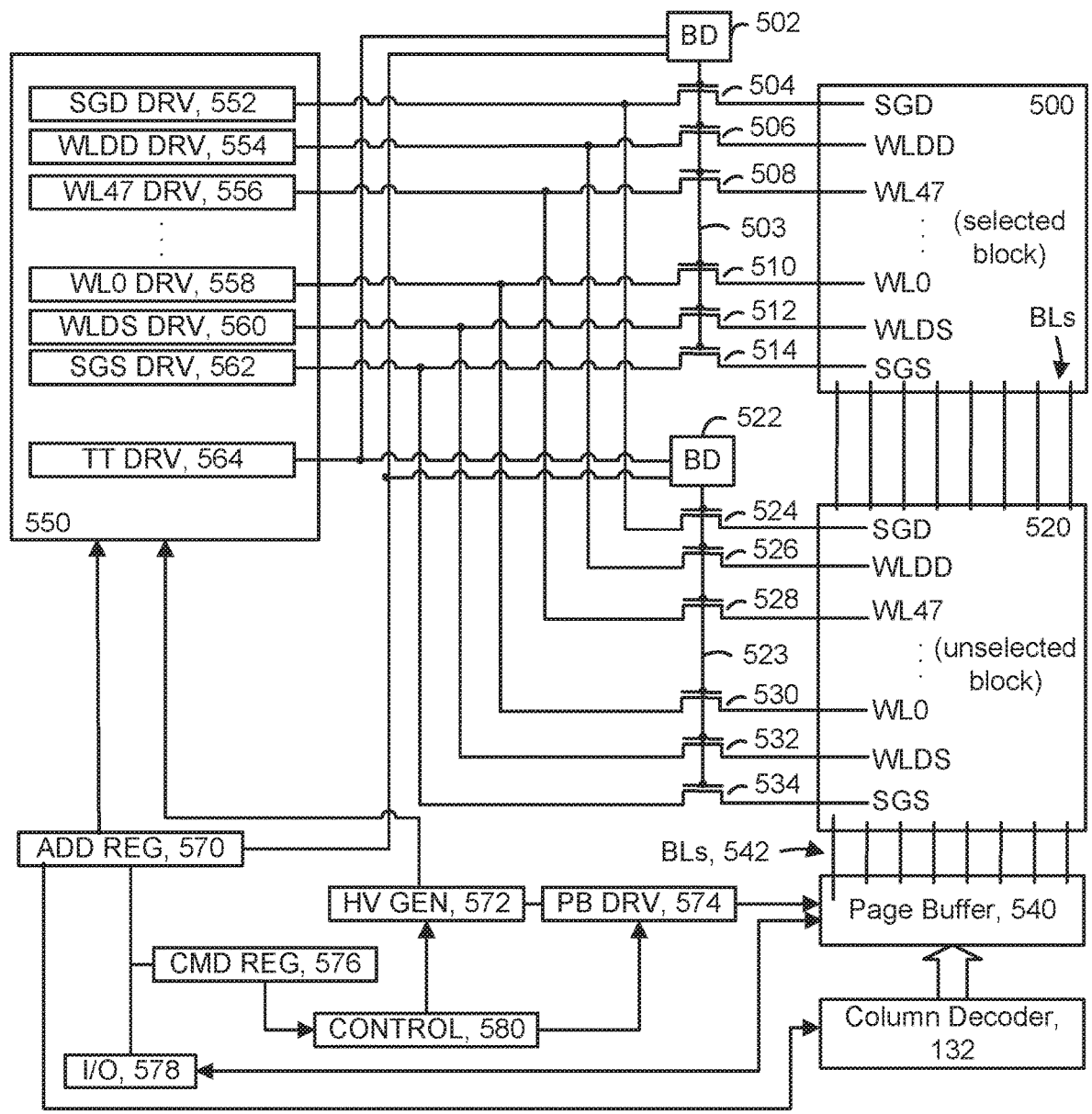
FIG. 3 depicts one embodiment of circuits for applying voltages to a memory structure.

FIGS. 1-3 describe one set of examples of a memory system that can be used to implement the technology proposed herein. FIG. 1 is a functional block diagram of an example memory system 100. The components depicted in FIG. 1 are electrical circuits. Memory system 100 includes one or more memory dies 108. The one or more memory dies 108 can be complete memory dies or partial memory dies. In one embodiment, each memory die 108 includes a memory structure 126, control circuitry 110, and read/write circuits 128. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel.

In some systems, a controller 122 is included in the same package (e.g., a removable storage card) as the one or more memory die 108. However, in other systems, the controller can be separated from the memory die 108. In some embodiments the controller will be on a different die than the memory die 108. In some embodiments, one controller 122 will communicate with multiple memory die 108. In other embodiments, each memory die 108 has its own controller. Commands and data are transferred between a host 140 and controller 122 via a data bus 120, and between controller 122 and the one or more memory die 108 via lines 118. In one embodiment, memory die 108 includes a set of input and/or output (I/O) pins that connect to lines 118.

Control circuitry 110 cooperates with the read/write circuits 128 to perform memory operations (e.g., write, read, and others) on memory structure 126, and includes programmable and reprogrammable microcontroller (MCU) 112, an on-chip address decoder 114, and a power control circuit 116. The microcontroller 112 provides die-level control of memory operations. In one embodiment, microcontroller 112 is programmable by software. In other embodiments, microcontroller 112 does not use software and is completely implemented in hardware (e.g., electrical circuits). In one embodiment, control circuitry 110 includes buffers such as registers, ROM fuses and other storage devices for storing default values such as base voltages and other parameters.

The on-chip address decoder 114 provides an address interface between addresses used by host 140 or controller 122 to the hardware address used by the decoders 124 and 132. Power control circuit 116 controls the power and voltages supplied to the word lines and bit lines during memory operations. Power control circuit 116 may include charge pumps for creating voltages. The sense blocks include bit line drivers.

Microcontroller 112 and/or controller 122 (or equivalently functioned circuits), in combination with all or a subset of the other circuits depicted in FIG. 2, can be considered a control circuit that performs the functions described herein. The control circuit can include hardware only or a combination of hardware and software (including firmware). For example, a controller programmed by firmware to perform the functions described herein is one example of a control circuit. A control circuit can include a processor, PGA (Programmable Gate Array, FPGA (Field Programmable Gate Array), ASIC (Application Specific Integrated Circuit), integrated circuit or other type of circuit.

In embodiment, control circuitry 110 (including microcontroller 112), read/write circuits 128, decoders 124 and decoders 132 are positioned on the substrate and underneath memory structure 126.

The (on-chip or off-chip) controller 122 (which in one embodiment is an electrical circuit) may comprise one or more processors 122c, ROM 122a, RAM 122b, a memory interface (MI) 122d and a host interface (HI) 122e, all of which are interconnected. The storage devices (ROM 122a, RAM 122b) store code (software) such as a set of instructions (including firmware), and one or more processors 122c is/are operable to execute the set of instructions to provide the functionality described herein. Alternatively or additionally, one or more processors 122c can access code from a storage device in the memory structure, such as a reserved area of memory cells connected to one or more word lines. RAM 122b can be to store data for controller 122, including caching program data (discussed below). Memory interface 122d, in communication with ROM 122a, RAM 122b and processor 122c, is an electrical circuit that provides an electrical interface between controller 122 and one or more memory die 108. For example, memory interface 122d can change the format or timing of signals, provide a buffer, isolate from surges, latch I/O, etc. One or more processors 122c can issue commands to control circuitry 110 (or another component of memory die 108) via Memory Interface 122d. Host interface 122e provides an electrical interface with host 140 data bus 120 in order to receive commands, addresses and/or data from host 140 to provide data and/or status to host 140.

In one embodiment, memory structure 126 comprises a three dimensional memory array of non-volatile memory cells in which multiple memory levels are formed above a single substrate, such as a wafer. The memory structure may comprise any type of non-volatile memory that are monolithically formed in one or more physical levels of arrays of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 126 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 126 is not limited to the examples above. Many different types of memory array architectures or memory technologies can be used to form memory structure 126. No particular non-volatile memory technology is required for purposes of the new claimed embodiments proposed herein. Other examples of suitable technologies for memory cells of the memory structure 126 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 1A:
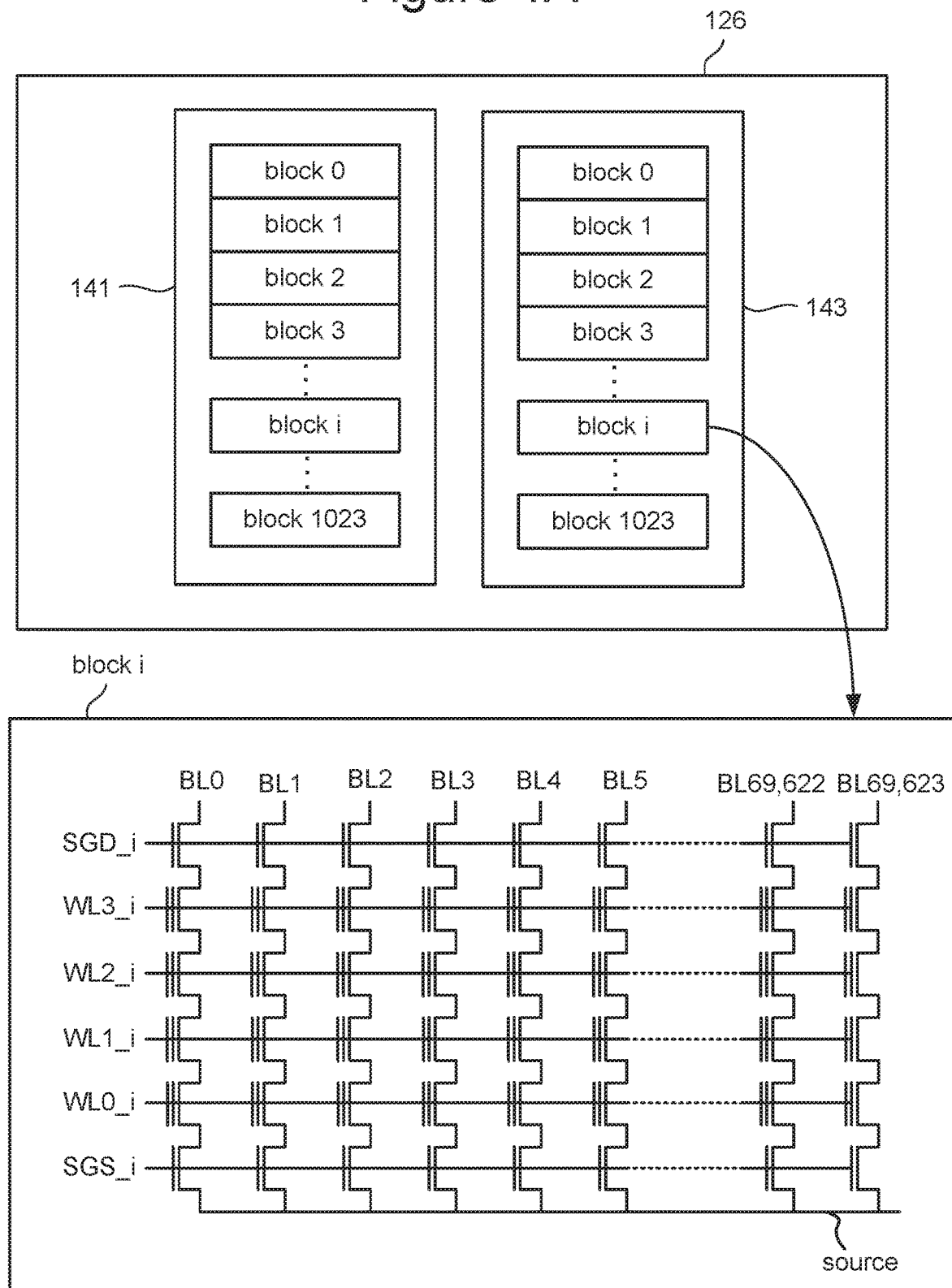
FIG. 1A is a block diagram depicting one example of a memory structure.

FIG. 1A depicts an example of memory structure 126. In one embodiment, an array of memory cells is divided into multiple planes. In the example of FIG. 1A, memory structure 126 is divided into two planes: plane 141 and plane 143. In other embodiments, more or less than two planes can be used. In some embodiments, each plane is divided into a number of memory erase blocks (e.g., blocks 0-1023, or another amount). In certain memory technologies (e.g. 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g. MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory structure 126. As used herein, a memory erase block is a contiguous set of memory cells that share word lines and bit lines; for example, erase block i of FIG. 1A includes memory cells that share word lines WL0_$i$, WL1_$i$, WL2_$i$ and WL3_$i$ and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 1A shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 1A shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and Error Correction Codes (ECC) that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block and the unit of programming and reading is a page. Other units of operation can also be used. Data can be stored/written/programmed, read or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data in to the memory structure 126. For example, in one embodiment, the memory storage unit is a page sized to hold 4 KB of data. In certain embodiments, a complete memory storage unit is sized to match the number of physical memory cells across a row of the memory structure 126. In one embodiment, an incomplete memory storage unit has fewer physical memory cells than a complete memory storage unit.

FIG. 1B is a block diagram depicting one embodiment of the sense block SB1 of FIG. 1A. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming operation, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a data latch processor 192, four example sets of data latches 194(0), 194(1), 194(2) and 194(3) and an I/O interface 198 coupled between the sets of data latches 194 and the lines 118.

In this example, each set of latches is associated with one of the bit lines. For example, data latches 194(0) are associated with bit line BL0, data latches 194(1) are associated with bit line BL1, data latches 194(2) are associated with bit line BL2, and data latches 194(3) are associated with bit line BL3. Each set of data latches includes data latches identified by LDL 151, MDL 152, and UDL 153, in this embodiment. LDL 151 stores a bit for a lower page of write data, MDL 152 stores a bit for a middle page of write data, and UDL 153 stores a bit for an upper page of write data, in a memory which stores three bits of data in each memory cell. Note that there may be one set of such latches associated with each bit line. The latches 194 may also be used to store data read from the non-volatile memory cells.

Additional or fewer data latches per set could be used as well. For example, in a two-bit per memory cell implementation, the MDL data latch for the middle page of data is not needed. A four-bit per memory cell implementation can use LDL, LMDL (lower-middle page), UMDL (upper-middle page), and UDL latches. The techniques provided herein are meant to encompass such variations. In a further option, another latch is used to identify whether a memory cell is in a slow programming mode when its threshold voltage is within a specified margin of the verify voltage of its target data state.

The data latch processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the MCU 112 which controls the supply of different control gate voltages to the addressed memory cell. As it steps through the various predefined control gate voltages corresponding to the various memory states supported by the memory, the sense module may trip at one of these voltages and a corresponding output will be provided from the sense module to the data latch processor 192 via the data bus 172. At that point, data latch processor 192 determines the memory state by consideration of the tripping event(s) of the sense module and the information about the applied control gate voltage from the MCU 112 via input lines 193. It then computes a binary encoding for the memory state and stores the resultant data bits into the data latches 194. For example, the memory state for a memory cell associated with bit line BL0 may be stored in latches 194(0), etc. Herein, a "memory state" may also be referred to as a "data state." In another embodiment of the managing circuit MC0, the bit line latch serves both as a latch for latching the output of the sense module and also as a bit line latch as described above.

In one embodiment, the MCU 112 executes instructions to control the data latch processor 192 to test conditions of non-volatile memory cells in response to voltages applied to the memory structure 126 (such as reference voltages applied to the non-volatile memory cells). The condition of a non-volatile memory cell can be any physical parameter of a non-volatile memory cell. Example conditions include, but are not limited to, a data state (e.g., S0-S7 in FIG. 4), a conduction current, a resistance, and a transistor threshold voltage. The manner in which the condition may be tested may include, but is not limited to, sensing, reading, detecting, measuring, probing, discovering, discriminating, checking, examining, and determining. As used herein a "test" comprises sensing, reading, detecting, measuring, probing, discovering, discriminating, checking, examining, determining, and the like. Therefore, a test condition means any action taken to determine, derive or identify what the state, condition, status, or position of a memory cell is when the action is taken.

In one embodiment, the MCU 112 executes instructions to control the data latch processor 192 to determine a data state (e.g., S0-S7 in FIG. 4) of memory cells. The data state, in certain embodiments, may be defined by a range of some physical parameter including, but not limited to, transistor threshold voltage, resistance, or current. Thus, in one embodiment, to determine a data state means to determine which one of multiple non-overlapping ranges of a certain physical parameter a memory cell is in. In one embodiment, the MCU 112 executes instructions to control the data latch processor 192 to determine whether a memory cell conducts a current in response to voltages applied to the memory cell. In one embodiment, the MCU 112 executes instructions to control the data latch processor 192 to determine whether the threshold voltage of a memory cell is above or below a reference voltage (e.g., Vr1-Vr7; or Vv1-Vv7 in FIG. 4) applied to the memory cell.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the MCU 112 receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the MCU 112 knows to terminate the programming process. Because each processor communicates with four sense modules, the MCU 112 needs to read the wired-OR line four times, or logic is added to data latch processor 192 to accumulate the results of the associated bit lines such that the MCU 112 need only read the wired-OR line one time. Similarly, by choosing the logic levels correctly, the MCU 112 can detect when the first bit changes its state and change the algorithms accordingly.

During program or verify operations, the data to be programmed (write data) is stored in the data latches 194 from the lines 118, in the LDL, MDL, and UDL data latches. For example, the data to be programmed in a selected memory cell associated with bit line BL0 may be stored in latches 194(0), the data to be programmed in a selected memory cell associated with bit line BL1 may be stored in latches 194(1), etc. The programming operation, under the control of the MCU 112, comprises a series of programming voltage pulses applied to the control gates of the addressed memory cells. Each programming voltage is followed by a read back (verify test) to determine if the memory cell has been programmed to the desired memory state. In some cases, data latch processor 192 monitors the read back memory state relative to the desired memory state. When the two states agree, the data latch processor 192 sets the bit line latch to cause the bit line to be pulled to a state designating program inhibit (e.g., 2-3 V). This inhibits the memory cell coupled to the bit line from further programming even if programming voltages appear on its control gate. In other embodiments, the data latch processor 192 initially loads the bit line latch and the sense circuitry sets it to an inhibit value during the verify process.

Each set of data latches 194 may be implemented as a stack of data latches for each sense module. In some implementations, the data latches are implemented as a shift register so that the parallel data stored therein is converted to serial data for lines 118, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

FIG. 2 is a block diagram of example memory system 100, depicting more details of one embodiment of controller 122. The controller in FIG. 2 is a flash memory controller, but not that the non-volatile memory 108 is not limited to flash. Thus, the controller 122 is not limited to the example of a flash memory controller. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD).

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 2, controller 122 includes a front end module 208 that interfaces with a host, a back end module 210 that interfaces with the one or more non-volatile memory die 108, and various other modules that perform functions which will now be described in detail.

The components of controller 122 depicted in FIG. 2 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 2 is one example implementation that may (or may not) use the components of controller 122 depicted in FIG. 1 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 2 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

One embodiment includes a writing/reading manager 236, which can be used to manage (in conjunction with the circuits on the memory die) the writing and reading of memory cells. In some embodiments, writing/reading manager 236 performs the processes depicted in the flow charts described below.

Additional components of system 100 illustrated in FIG. 2 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the memory 126 of die 108. The MML 238 may be needed because: 1) the memory may have limited endurance; 2) the memory 126 may only be written in multiples of pages; and/or 3) the memory 126 may not be written unless it is erased as a block. The MML 238 understands these potential limitations of the memory 126 which may not be visible to the host. Accordingly, the MML 238 attempts to translate the writes from host into writes into the memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, in a laptop, in a tablet, in a server, etc. Additionally, the SSD need not be made to work as a hard drive.

Some embodiments of a non-volatile storage system will include one memory die 108 connected to one controller 122. However, other embodiments may include multiple memory die 108 in communication with one or more controllers 122. In one example, the multiple memory die can be grouped into a set of memory packages. Each memory package includes one or more memory die in communication with controller 122. In one embodiment, a memory package includes a printed circuit board (or similar structure) with one or more memory die mounted thereon. In some embodiments, a memory package can include molding material to encase the memory dies of the memory package. In some embodiments, controller 122 is physically separate from any of the memory packages.

FIG. 3 is a diagram that shows further details of one embodiment of circuits for applying voltages to a memory structure 126. Two blocks 500, 520 of memory cells are depicted. Circuits of FIG. 3 apply voltages to word lines and select lines. The MCU 112 provides control signals to the circuits, in one embodiment. For example, the MCU 112 may issue control signals to one or more of CONTROL 580, HV (High Voltage) GEN (Generator) 572, PB (Page Buffer) DRV (Driver) 574, CMD (Command) REG (Register) 576, I/O (Input/Output) Buffer 578. In one embodiment, the MCU 112 issues control signals to CONTROL 580, which in turn controls other elements such as HV GEN 572 and PB DRV 574.

HV GEN 572 is connected to the word line driver 550, to control magnitudes and timing of voltages, in one embodiment. PB DRV 574 is connected to page buffer 540 to control the page buffer 540. The page buffer 540 may include sense blocks, such as SB1 in FIG. 1B.

Each block of storage elements is associated with a set of transfer transistors, in one possible embodiment. For example, block 500, which is the selected block in this example, e.g., a block in which a programming or sense operation is to take place, includes a drain-side select gate (SGD) connected to a transfer transistor 504, a drain-side dummy word line (WLDD) connected to a transfer transistor 506, a word line (WL47) connected to a transfer transistor 508, intermediate word lines WL30-WL1 (not shown) connected to respective transfer transistors (not shown), a word line (WL0) connected to a transfer transistor 510, a source-side dummy word line (WLDS) connected to a transfer transistor 512, and a source-side select gate (SGS) connected to a transfer transistor 514. The control gate of each transfer transistor of the block 500 is connected to a block decoder (BD) 502 via a common path 503. The BD 502 receives a voltage from a transfer transistor driver (TT DRV) 564 and a control signal from an address register (ADD REG) 570. The control signal includes an address. If the address matches an address of the BD 502, the BD 502 acts as a conductive switch which passes the voltage to the control gates of the associated transfer transistors via path 503. If the address does not match the address of the BD 502, the BD 502 acts as a non-conductive switch which does not pass the voltage to the control gates of the associated transfer transistors.

Each transfer transistor may be an nMOSFET, for example, which has a drain node on the left hand side and a source node on the right hand side. The drain node for each transfer transistor is connected to a respective voltage driver in a set of high-voltage voltage drivers 550. Each driver may include an on-chip charge pump. For example, the transfer transistor 504 is connected to a drain select gate driver (SGD DRV) 552, the transfer transistor 506 is connected to a dummy word line driver (WLDD DRV) 554, the transfer transistor 508 is connected to the word line driver (WL47 DRV) 556, . . . , the transfer transistor 510 is connected to the word line driver (WL0 DRV) 558, the transfer transistor 512 is connected to the source side dummy word line driver (WLDS DRV) 560, and the transfer transistor 514 is connected to the source select gate driver (SGS DRV). Each voltage driver can be independently controlled to provide a desired output voltage.

A similar arrangement is used for the example unselected block 520, which includes a transfer transistor 524 connected to SGD and SGD DRV 552, a transfer transistor 526 connected to WLDD and WLDD DRV 554, a transfer transistor 528 connected to WL47 and WL47 DRV 556, ..., a transfer transistor 530 connected to WL0 and WL0 DRV 558, a transfer transistor 532 connected to WLDS and WLDS DRV 560, and a transfer transistor 534 connected to SGS and SGS DRV 562. The control gates of the transfer transistors of the unselected block 520 are connected to a respective block decoder (BD) 522 via a common path 523. The BD 522 is also connected to the TT DRV 564 to receive a voltage, and to the address register 570 to receive a control signal which instructs the BD 522 to pass or not pass the voltage to the control gates of the associated transfer transistors via path 523. The address register (ADD REG) 570 also communicates with the voltage drivers in the set of high-voltage voltage drivers 550.

A number of bit lines (BLs) 542 extend across the selected block 500 and the unselected block 520 (and across additional unselected blocks, not shown, in some implementations) and into a page buffer 540, which is responsive to a column decoder 132. The page buffers stores data which is written into, or read from, a selected word line of the selected block. During an operation of the memory device, the address register 570 provides a data load command to an input-output buffer 578 and to a command register 576. The input-output buffer 578 provides the command to the page buffer 540. The command register 576 provides a command to a control circuit 580, which instructs a high voltage generator 572 to control the voltage drivers 550 at appropriate levels. Typically, during programming, the driver of the selected word line provides a programming level voltage, such as 12-26 V while the unselected word lines receive a pass voltage $V_{PASS}$ such as 4-6 V. During sensing, the driver of the selected word line provides a read or verify level voltage ($V_{CGR}$ or $V_{VERIFY}$, respectively), while the unselected word lines receive a read pass voltage, $V_{READ-PASS}$. The control 580 also instructs the page buffer driver (PB DRV) 574 to control the page buffer 540. The address register 570 also communicates with the column decoder 132.

Figure 4:
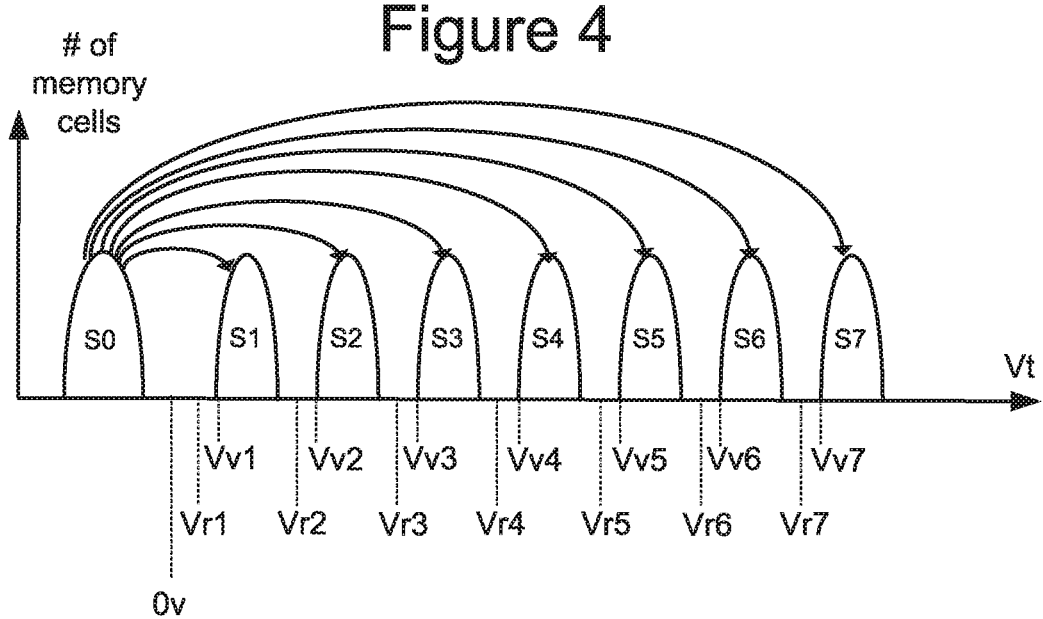
FIG. 4 depicts threshold voltage distributions.

The memory systems discussed above can be erased, programmed/written and read. At the end of a successful programming process (with verification), the threshold voltages of the memory cells should be within one or more distributions of threshold voltages for programmed memory cells or within a distribution of threshold voltages for erased memory cells, as appropriate. FIG. 4 illustrates example threshold voltage distributions for the memory cell array when each memory cell stores three bits of data. Other embodiments, however, may use other data capacities per memory cell (e.g., such as one, two, four, or five bits of data per memory cell). FIG. 4 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring data state, only one bit will be affected.

FIG. 4 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, ... ) a memory cell is in.

FIG. 4 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 4 represent the full sequence programming. The technology described herein can also be used with other types of programming in addition to full sequence programming (including, but not limited to, multiple stage/phase programming). In some embodiments, data states S1-S7 can overlap, with controller 122 relying on ECC to identify the correct data being stored.

The proposed technology described herein can be used for embodiments in which each memory cell stores one bit of data per memory cell (also referred to as SLC) and for embodiments in which each memory cell stores multiple bits of data per memory cell (FIG. 4). When memory cells store one bit of data per memory cell, there may be two data states. When memory cells store two bits of data per memory cell, there may be four data states.

Figure 5:
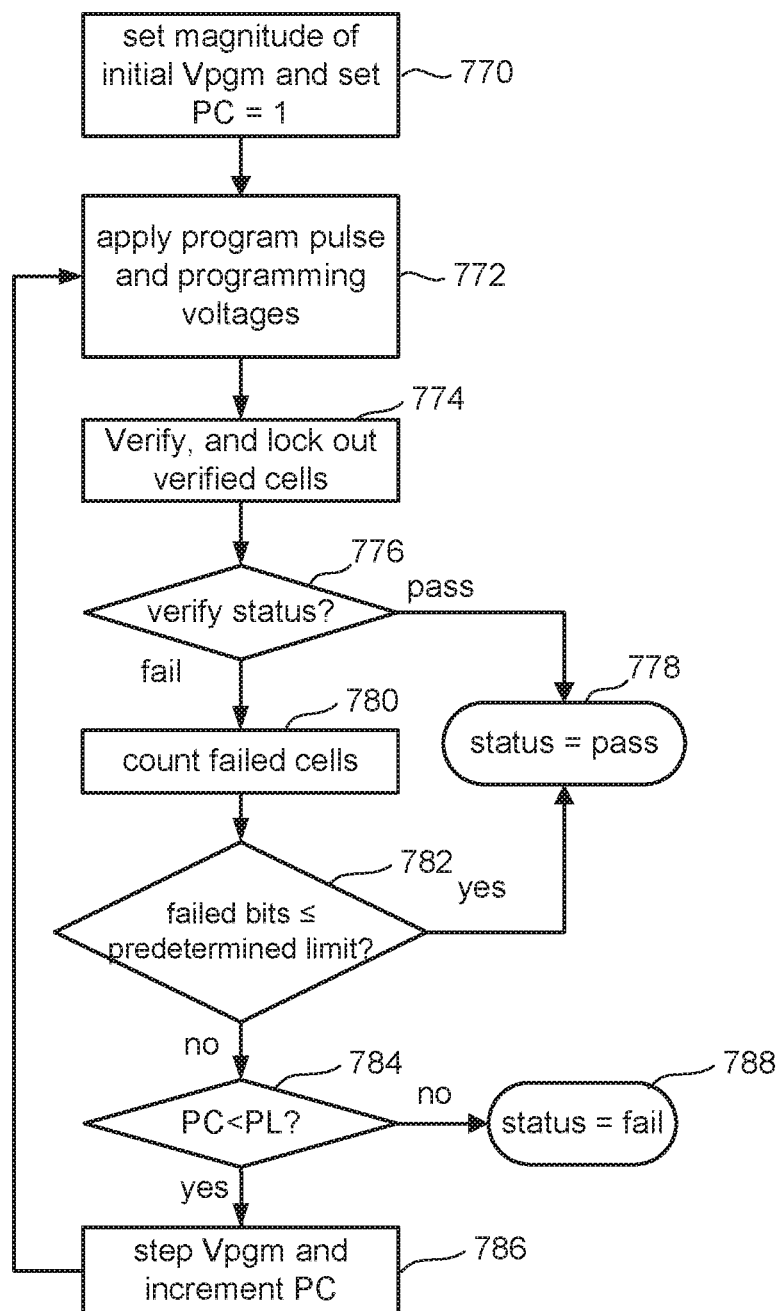
FIG. 5 is a flow chart describing one embodiment of a process for programming/writing data into memory cells connected to a common word line.

FIG. 5 is a flowchart describing one embodiment of a process for programming. The process of FIG. 5 is performed by the memory die in response instructions, data and addresses from controller 122, in one embodiment. In one example embodiment, the process of FIG. 5 is performed on memory die 108 using the one or more control circuits discussed above (see FIG. 1), at the direction of microcontroller 112. The process of FIG. 5 can also be used to implement the full sequence programming discussed above. The process of FIG. 5 can also be used to implement each phase of a multi-phase programming process. Additionally, the process of FIG. 5 can be used to program memory cells connected to the same word line with one bit of data per memory cell.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 770 of FIG. 5, the programming voltage (Vpgm) is initialized to the starting magnitude (e.g., ~12-16V or another suitable level) and a program counter PC maintained by microcontroller 112 is initialized at 1. In step 772, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~7-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 772, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 774, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 776, it is determined whether all the memory cells have reached their target threshold voltages (pass). If so, the programming process is complete and successful because all selected memory cells were programmed and verified to their target data states. A status of "PASS" is reported in step 778. If, in 776, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the microcontroller, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 778. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not pre-determined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 772 and another program pulse is applied to the selected word line so that another iteration (steps 772-786) of the programming process of FIG. 5 is performed.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 4) or verify operation (e.g. see verify reference voltages Vv1, Vv2, Vv3, Vv4, Vv5, Vv6, and Vv7 of FIG. 4) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, partial pages (a subset of a page), word line units, blocks, jumbo blocks, or other units.

Step 772 of FIG. 5 includes applying a program voltage pulse on the selected word line. Step 774 of FIG. 5 includes verification, which in some embodiments comprises applying the verify reference voltages on the selected word line. As steps 772 and 774 are part of an iterative loop, the program voltage is applied as a series of voltage pulses that step up in magnitude. Between voltage pulses, verify reference voltages are applied. The system tests the memory cells to determine whether threshold voltages of the memory cells are greater than the respective verify reference voltages by applying the verify references voltages as verify pulses.

Figure 6:
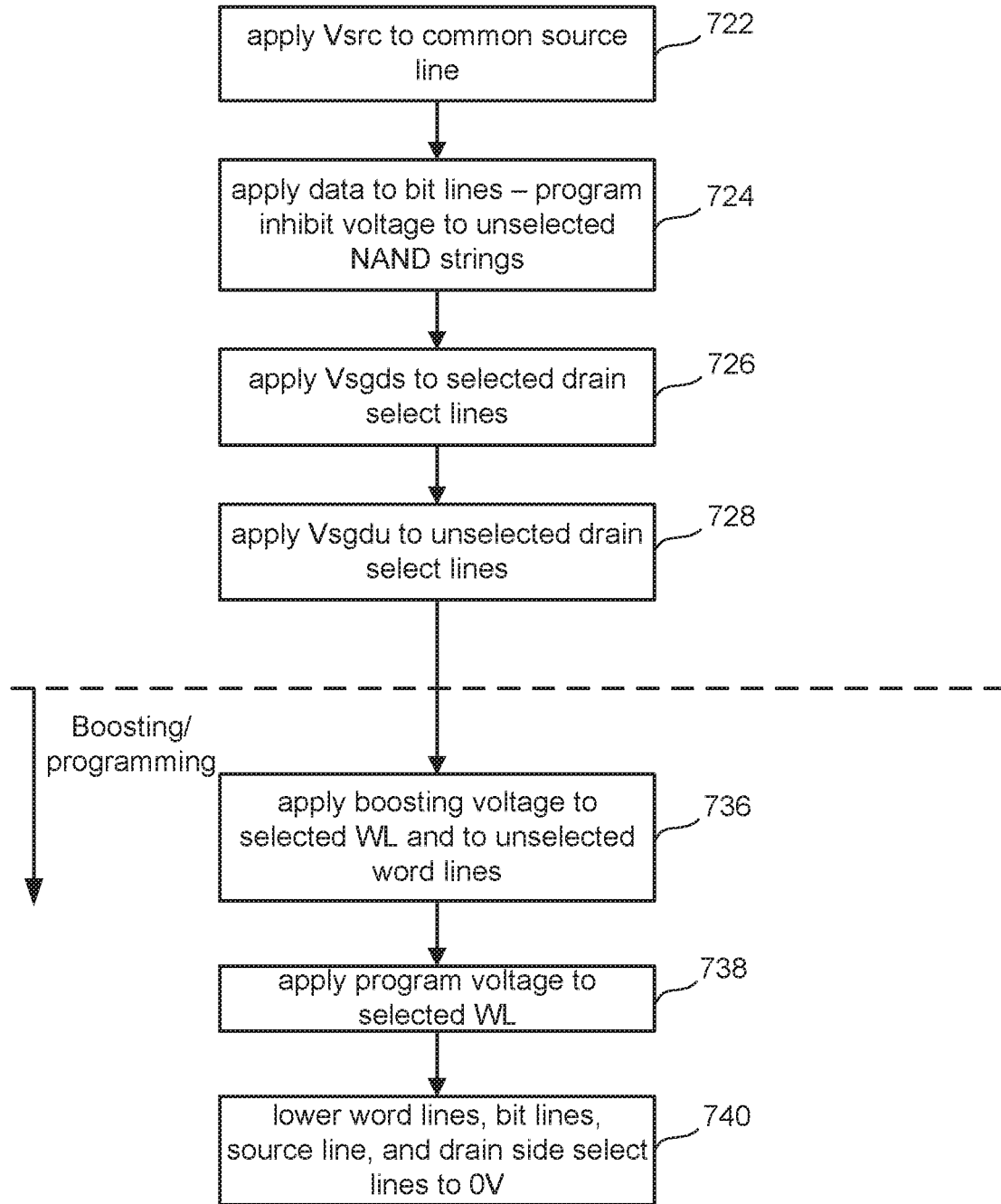
FIG. 6 is a flowchart of one embodiment details of programming non-volatile storage during step 772 of FIG. 5.
Figure 7:
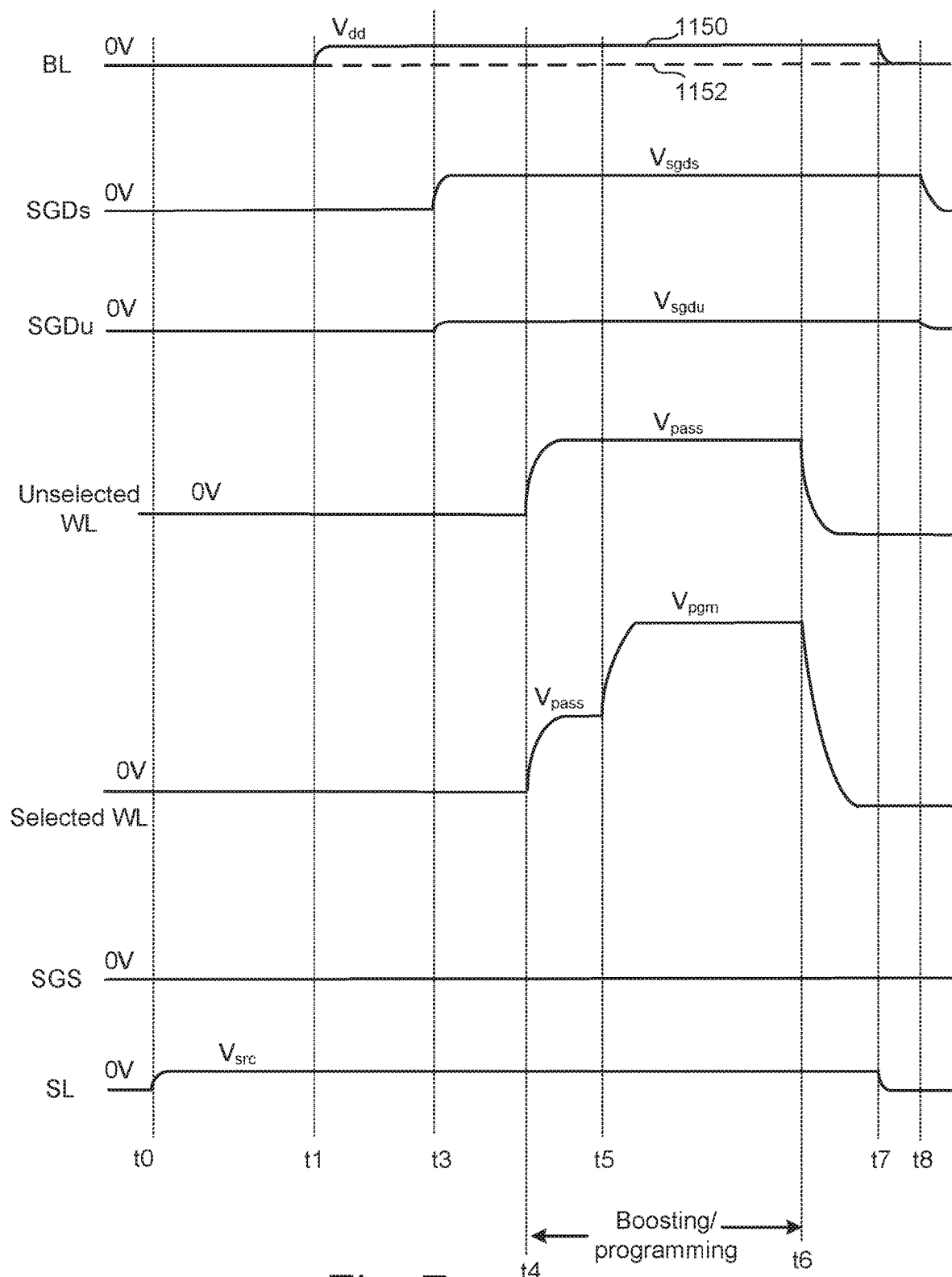
FIG. 7 shows timing of various signals during one embodiment of the process of FIG. 5.

FIG. 6 is a flowchart of one embodiment of applying a program pulse and programming voltages that may be used in step 772 of FIG. 5. This process is used to program 3D NAND in one embodiment. FIG. 7 shows timing of various signals during one embodiment of the process of FIG. 6. The MCU 112 controls the timing and magnitudes of the signals in FIG. 7, in one embodiment. Note that the various signals in FIG. 7 are just one example of voltages applied to the memory structure 126 during a memory operation. The timing of the signals in FIG. 7 is one example of a "core timing chart" or CTC.

A low voltage is applied to the source line at step 722. Referring to FIG. 7, the common source line SL is raised to a low voltage Vsrc (e.g., about 1.0V-1.5V) at time t0 where it remains for the duration of the programming process. The source line SL is kept at 0V in some embodiments. The source select line SGS remains at 0V to place the source select transistors into isolation mode. As one example this could be on the order of 1.0V-1.5V. Note that the other signals in FIG. 7 are at 0V at time t0.

At step 724, the data is applied to the bit lines. The data may be applied to the bit lines based on whether a memory cell in the NAND strings that are in the present programming operation is to be programmed. If the memory cell is to be programmed, then its associated bit line has a program enable voltage (e.g., Vbl_Program_Enable) applied to it. If the memory cell is not to be programmed, then its associated bit line has a program inhibit voltage (e.g., Vbl_Inhibit) applied to it.

Referring to FIG. 7, line 1152 shows the bit line voltage at 0V for a NAND string (in the set that are a part of the present programming operation) having a memory cell at the selected word line WLn that is to be programmed. Line 1150 shows the bit line voltage at VDD for a NAND string (in the set that are a part of the present programming operation) having a cell at WLn that is to be inhibited from programming. VDD designates program inhibit and is often referred to as a program inhibit voltage. Note that line 1152 represents one example of V_Program_Enable, and that line 1150 represents one example of Vbl_Inhibit.

Step 726 is to apply Vsgds to selected drain side select lines. Step 728 is to apply Vsgdu to unselected drain side select lines. Note that FIG. 7 shows two SGD lines. Line SGDs refers to a drain side select line having at least one NAND string that is currently programming. Line SGDu refers to a drain side select line having no NAND strings currently programming.

Referring to FIG. 7, at time $t_3$, drain side select line SGDs is raised to Vsgds, and drain side select line SGDu is raised to Vsgdu. The voltage Vsgds turns on the drain side select transistor for NAND strings having a memory cell being programmed. Note that Vbl_Program_Enable is being applied to the selected bit line BL0 at time $t_3$.

Note that at this time Vsgds may also be applied to control gates of drain side select transistors of NAND strings for which no memory cell should be programmed. However, note that Vbl_Inhibit is being applied to the unselected bit line BL1 at time $t_3$.

Referring again to FIG. 7, at time $t_3$, drain side select line SGDu is set to Vsgdu. The voltage Vsgdu should keep off the associated drain side select transistor.

At step 736, a boosting voltage (e.g., $V_{PASS}$) is applied to unselected word lines. Note that the magnitude for $V_{PASS}$ does not need to be the same for each of the unselected word lines. There are a variety of boosting schemes that can be used. Examples of boosting schemes include, but are not limited to, self-boosting (SB), local self-boosting (LSB) and erase area self-boosting (EASB).

Referring to FIG. 7, at time $t_4$, the boosting/programming phase begins. The boosting voltages are applied to the various word lines at time $t_4$. In one embodiment, each unselected word line receives a boosting voltage $V_{PASS}$. In one embodiment, the voltage applied to the unselected word lines depends on their position relative to the selected word line.

In one embodiment, a pass voltage is applied to at least a subset of unselected word lines during a program operation. The pass voltage is typically less than the program voltage. As one example, the pass voltage may be 10 volts. However, the pass voltage could be higher or lower. The pass voltage may assist in boosting channels of memory cells. In one embodiment, capacitive coupling between the control gate and channel lifts the channel potential. Thus, the pass voltage that is applied to the control gate may serve to boost the channel potential.

The program voltage $V_{PGM}$ is then applied to the selected word line at step 738. With the boosting voltages applied and the inhibited NAND string channels boosted, program disturb of unselected memory cells on the selected word line is prevented or reduced.

Referring to FIG. 7, at time $t_5$, the program voltage $V_{PGM}$ is applied to the selected word line WLn. Because the inhibited NAND string channel is boosted when the program voltage is applied, the unselected memory cells at WLn for the inhibited NAND strings will not be programmed. The boosted channel region voltage decreases the potential across those memory cells' tunnel dielectric regions, thus preventing any inadvertent programming.

At step 740, the word lines, bit lines, source lines, and drain select lines are lowered to 0V, marking the completion of one programming iteration. It should be noted that the steps of FIG. 6 can be applied with each iteration of the process of FIG. 5, with the program voltage being increased each iteration. However, it is not required that the program voltage increase in magnitude with each iteration.

Referring to FIG. 7, at time t6, the word lines are lowered to 0V. The source and bit lines are then lowered to 0V at time t7. The drain select line SGD is lowered to 0V at time t8.

Numerous variations to the signals depicted in FIG. 7 can be made in accordance with embodiments. Also note that timing and/or magnitudes of the signals in FIG. 7 (as well as other CTCs) can be modified by modifying instructions executed by the MCU 112. For example, if it is determined that the length of time for which the programming voltage is applied should be changed, then the instructions can be modified to change the length of time between t5 and t6 in the CTC of FIG. 7. Many other modifications to CTCs can be made by modifying instructions executed by the MCU 112 and/or by modifying data that the MCU 112 uses to executed the instructions.

Figure 8:
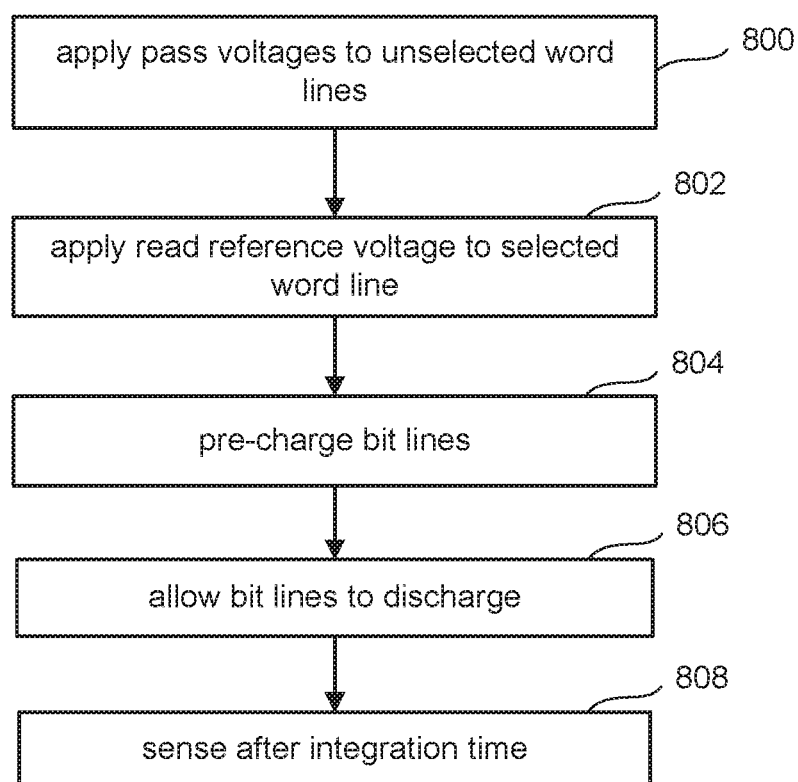
FIG. 8 is a flow chart describing one embodiment of a process for reading data from non-volatile memory cells.

FIG. 8 is a flow chart describing a sensing operation performed in order to read data from the memory cells. In step 800, a pass voltage is applied to unselected word lines so that unselected memory cells on a NAND string are conducting, which enables the system to test whether the selected memory cell conducts in response to the read reference voltage. This pass voltage is often referred to as Vread. In step 802, the appropriate read reference voltage, also referred to as Vcgr, is applied to the selected word line. In one example of a system that stores one bit per memory cell, Vcgr=0 v, or a small voltage near 0 v. In step 804, all of the bit lines are pre-charged. In one example embodiment, the bit lines are pre-charged by charging a capacitor in the sense amplifier and then putting the bit line in communication with the charged capacitor so that the bit line charges up. In step 806, the bit line is allowed to discharge, for example, by discharging the capacitor. After a predetermined time period, referred to as the "integration time" or "strobe time" the voltage of the capacitor is sampled to see whether the respective memory cell(s) conducted in step 808. If the memory cell conducts in response to Vcgr, then the threshold voltage of the memory cell is less than Vcgr. If Vcgr=0 v and the memory cell turns on, then the memory cell is in the erased state and the data stored is 1. If Vcgr=0 v and the memory cell does not turn on, then the memory cell is in the programmed state and the data stored is 0.

FIG. 9 is a flowchart of an embodiment of process 900 for sensing memory cells. The process 900 may be used for reading or program verify. The process 900 may be used to determine a data state of a memory cell. Process 900 sensing at multiple reference levels. For a read operation, the process progressively steps through levels Vr1-Vr7 (see FIG. 4), in one embodiment. For a program verify operation, the process progressively steps through levels Vv1-Vv7 (see FIG. 4), in one embodiment.

Step 902 includes applying pass voltages to unselected word lines. Step 904 includes applying a reference voltage to the selected word line. This might be Vr1 or Vv1, for example.

Step 906 includes sensing the selected memory cells. In one embodiment, the sense module (e.g., SM0, SM1, . . . ) connected to the bit line for one of the selected memory cells may trip in response to the reference voltage applied to the selected word line. A corresponding output will be provided from the sense module to the data latch processor 192 via the data bus 172. Based on the reference level when the sense module trips, the data latch processor 192 may determine the data state (e.g., S0-S7) of the selected memory cell. To determine a data state means to determine which one of multiple non-overlapping ranges of a certain physical parameter a memory cell is in. For example, with reference to reading at the reference levels in FIG. 4, the memory cell is in data state S4 if it has a threshold voltage between Vr4 and Vr5. Note that the range of the physical parameter could be unbounded on one side. For example, the range for S7 in FIG. 4 may be unbounded on the upper side. Also, the range for S0 in FIG. 4 may be unbounded on the lower side. Note that steps 904-906 may be referred to herein as a "sensing phase."

Step 908 is a determination of whether there is another reference level to apply to the selected word line. If so, the process 900 returns to step 904 to apply the next reference level. Step 906 is then performed again to test the selected memory cells.

After all reference levels have been applied to the selected word line, step 910 may be performed. In step 910, the data latch processor 192 outputs the data state (e.g., S0-S7) of each of the selected memory cells. Note that it is not required that the data state be output by the data latch processor 192 for a program verify operation.

As described above, in one embodiment a page is the unit of operation for programming (writing) and reading. In one example, a page is all the data stored in all memory cells connected to a common word line. In other embodiments, a page can be one bit of data from each memory cell connected to a common word line. In other embodiments, pages can include other aggregations of data. In one example, a page of data is 16 KB. In some embodiments, the system requires all writing and reading to be by the page. In other embodiments, the system allows partial pages to be written to and read. Example of a partial page can be 2 KB or 4 KB. Other subsets of a page can also be used as a partial page.

Previous state machine designs require tape-out or engineering change orders for each design change of new feature. This slows down the development process. Therefore, it is proposed to use a programmable and reprogrammable microcontroller (e.g., microcontroller 112 of FIG. 1) in place of the previously used state machine. Features can be added and functionality can be changed by updated the software (including firmware) for the microcontroller 112.

Microcontroller 112 provides on-die control for reading, programming, and erasing the non-volatile memory cells of memory structure 126. Additionally, microcontroller 112 provides on-die control for interfacing with controller 122.

Figure 10A:
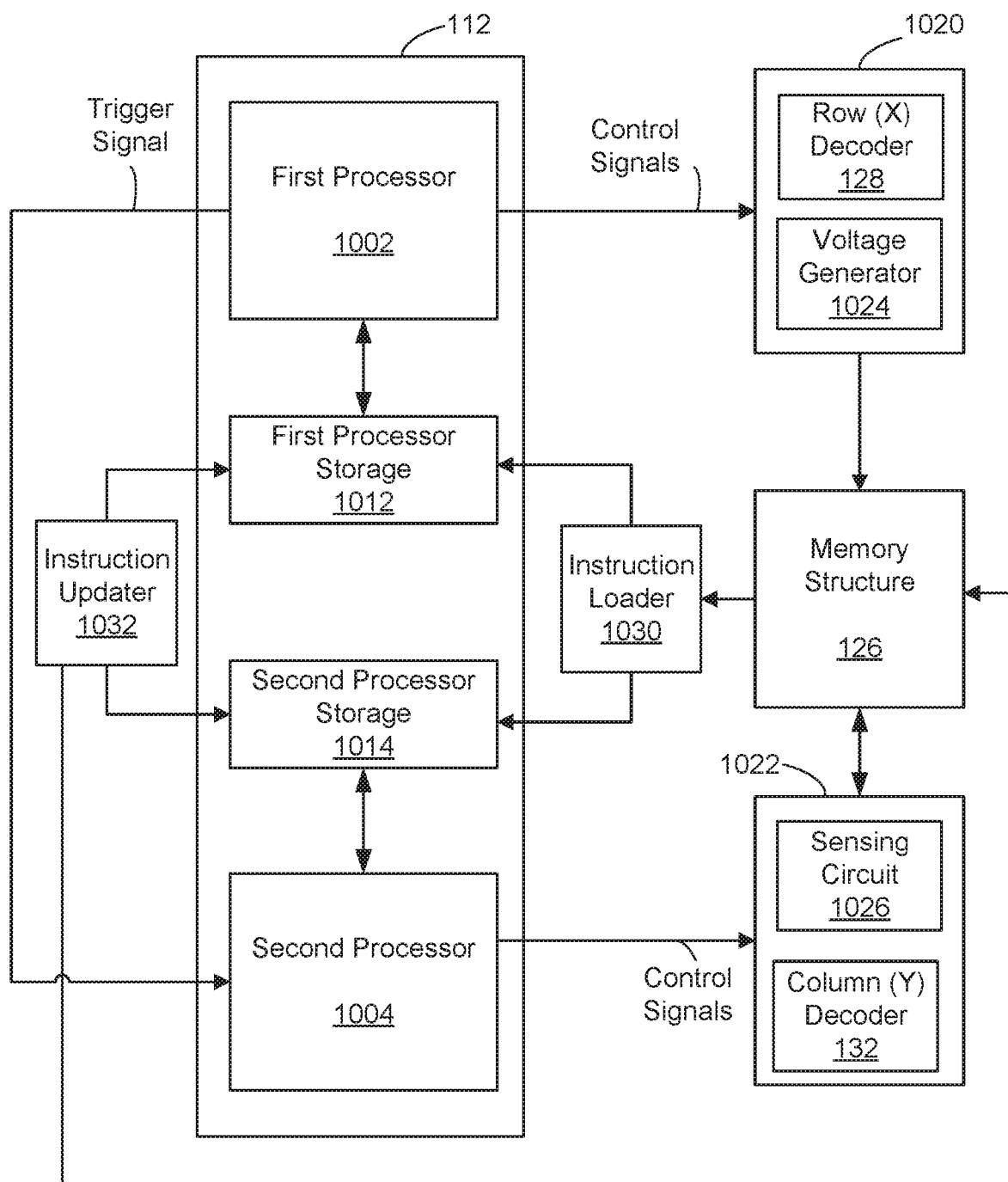
FIG. 10A is a high-level block diagram of one embodiment of microcontroller, having two processors, and other elements.

FIG. 10A is a high-level block diagram of one embodiment of microcontroller 112, and other elements. The other elements include a memory structure 126, which contains non-volatile memory cells, first circuit 1020, and second circuit 1022. The first circuit 1020 includes a voltage generator 1024 and row decoder 124. The first circuit 1020 is configured to apply voltages to the memory structure 126. This may include voltages to one or more of word lines, select lines (e.g., SGD, SGS), source lines, as well as other elements in the memory structure 126. The first circuit 1020 may include decoders (e.g., row decoder 124) and charge pumps, which provide the voltages for word lines, select lines (e.g., SGD, SGS), source lines, as well as other elements in the memory structure 126. The first circuit 1020 may include power control circuit 116 and/or on-chip address decoder 114. In one embodiment, the first circuit 1020 includes one or more of the elements in FIG. 4 that are connected to the blocks 500, 520. For example, the voltage generator 1024 may include high-voltage voltage drivers 550 (each driver may include an on-chip charge pump). The row decoder 124 may include one or more of block decoder (BD) 522, transfer transistors 504-514, 524-534. The first circuit 1020 may include other elements from FIG. 3 such as CONTROL 580, HV GEN 572, CMD REG 576, and/or ADD REG 570. Note that the first circuit 1020 is not limited to the embodiment depicted in FIG. 3.

The second circuit 1022 is configured to test conditions of the non-volatile memory cells in response to the voltages applied to the memory structure 126. The second circuit 1022 includes sensing circuit 1026 and column decoders 132. The sensing circuit 1026 may include and control sense amplifiers that sense a current of a memory cell.

In one embodiment, the sensing circuit 1026 includes all or a portion of a sense block (see, for example, SB1 in FIG. 1B). For example, sensing circuit 1026 may include sense modules (e.g., SM0, SM1, SM2, SM3) and data latches (e.g., latches 194). In one embodiment, sensing circuit 1026 includes data latch processor 192 (see FIG. 1B). In one embodiment, data latch processor 192 tests conditions of the non-volatile memory cells in response to the voltages applied to the memory structure 126. The second circuit 1022 may include one or more managing circuits (e.g., MC0, FIG. 1B). It is not required that the sensing circuit 1026 include all of the elements in the MC0 depicted in FIG. 1B. Also, the sensing circuit 1026 may include elements not depicted in MC0 of FIG. 1B. In one embodiment, the second circuit 1022 includes page buffer 540, PB DRV 574, and I/O 578 (see, FIG. 3). Note that CONTROL 580 may be shared between the first circuit 1020 and the second circuit 1022.

The microcontroller 112 includes a first processor 1002 and a second processor 1004. The first processor 1002 sends control signals to the first circuit 1020. The control signals could be analog or digital signals. The control signals may be sent over a communication medium. A communication medium may comprise one or more signal lines. A signal line is capable of transmitting an electrical signal, such as a voltage level, in some embodiments. For example, a signal line may be an electrically conductive path. A signal line is capable of transmitting an electromagnetic signal, such as an optical signal (e.g., light pulse), in some embodiments. For example, a signal line may comprise an optical waveguide. In embodiments, a signal line may include, but is not limited to, one or more of a wire, trace, transmission line, track, pad, layer, lead, metal, portion of a printed circuit board or assembly, conducting material and other material that may transfer or carry an electrical signal, and/or electromagnetic signal. In embodiments, a signal line may form one or more geometric shapes, such as a line or multiple connected lines. In embodiments, a signal line may be unidirectional or bidirectional in transferring signals between circuits and within circuits. Note that the communication medium may comprise elements other than the signal lines, such as drivers, buffers, or logic gates.

The first processor 1002 is configured to control the first circuit 1020 to control analog voltages (e.g., word line voltages, select line voltages, etc.) applied by the first circuit 1020 to the memory structure 126, in one embodiment. The first processor 1002 is configured to control decoders and charge pumps in the first circuit 1020, in one embodiment. The first processor 1002 is configured to control voltage levels applied by sense amplifiers, in one embodiment. Note that throughout this description, the phrase, "a processor is configured to control a circuit" or the like, does not require that the processor control all functionality of the circuit.

Note that the timing of the sequences of voltages applied by the first circuit 1020 in order to program, read, or erase memory cells may be very complex. In some embodiments, a core timing chart (CTC) specifies the timing of the sequences of voltages. FIG. 7 shows one example of timing of the sequences of voltages applied during a programing operation. The first processor 1002 is configured to implement the core timing chart (CTC) for different memory operations, in one embodiment. Thus, the first processor 1002 may be configured to execute first instructions to coordinate sequences of voltages applied to the memory structure 126 by the first circuit 1020 in order to perform memory operations with respect to non-volatile memory cells in the memory structure 126. The memory operations could be, for example, read, program, and/or erase operations. The first processor 1002 may also be referred to as a Core Processor (CP) or as a core machine (CM).

The second processor 1004 sends control signals to the second circuit 1022. The control signals could be analog or digital signals. The control signals may be sent over a communication medium. As noted above, a communication medium may comprise one or more signal lines, and may also comprise drivers, buffers, and/or logic gates. The second processor 1004 is configured to execute second instructions to control the second circuit 1022 to test conditions of the non-volatile memory cells in response to the voltages applied to the memory structure 126. The manner in which the conditions may be tested may include, but is not limited to, sensing, reading, detecting, measuring, probing, discovering, discriminating, checking, examining, and determining. For example, the second processor may control the second circuit 1022 to determine a data state of the non-volatile memory cells. In one embodiment, the second processor 1004 sends control signals to data latch processor 192 (see FIG. 1B).

In one embodiment, the second processor 1004 controls the sensing circuit 1026 to test conditions of non-volatile memory cells in memory structure 126 in response to voltages applied to the memory structure 126 (such as reference voltages applied to the non-volatile memory cells) by the voltage generator 1024. The condition of a non-volatile memory cell can be any physical parameter of a non-volatile memory cell. In one embodiment, the second processor 1004 controls the sensing circuit 1026 to determine a data state (e.g., S0-S7 in FIG. 4) of memory cells. In one embodiment, the second processor 1004 controls the sensing circuit 1026 to determine whether a memory cell conducts a current in response to voltages applied to the memory cell by the voltage generator 1024. In one embodiment, the second processor 1004 controls the sensing circuit 1026 to determine whether the threshold voltage of a memory cell is above or below a reference voltage (e.g., Vr1-Vr7; Vv1-Vv7 in FIG. 4) applied to the memory cell.

For example, with reference to FIG. 4, the second processor 1004 may control the second circuit 1022 to determine which of the data states (e.g., S0-S7) each of a set of memory cells is in. In one embodiment, the second processor 1004 controls the second circuit 1022 to test whether selected memory cells have a threshold voltage above or below a reference voltage applied by the power control circuit 116. The reference voltage might be one of Vr1-Vr7, with reference to FIG. 4, in the event that a read operation is being performed. The reference voltage might be one of Vv1-Vv7, with reference to FIG. 4, in the event that a program verify operation is being performed. The second processor 1004 may also be referred to as a Sense Processor (SP). The Sense Processor may alternatively be referred to as a Y processor (YP) or Y machine (YM) due to the association between sensing and the Y-decoder 132, in some embodiments. In one embodiment, the second processor 1004 executes instructions in the second processor storage 1014 in response to a trigger signal ("Trigger Signal") from the first processor 1002. This allows the first processor 1002 to control the timing of sensing operations relative to the timing of voltages applied to the memory structure 126 by the first circuit 1020. Stated another way, this allows the activities (e.g., sensing) of the second circuit 1022 to be coordinated with the activities (e.g., applying voltages to the memory structure 126) of the first circuit 1020. For example, during a sensing operation, the first processor 1002 can control the first circuit 1020 to establish appropriate voltage levels applied to memory cells; then, after appropriate voltage levels are applied to memory cells, the first processor 1002 can trigger the second processor 1004 to initiate a sensing operation (by the second processor 1004 controlling the second circuit 1022. The trigger signal may be an analog or digital signal. In one embodiment, the trigger signal has two states: logical high (which triggers the second processor) and logical low (which does not trigger the second processor). The trigger signal is an active high signal, in one embodiment. The trigger signal is an active low signal, in one embodiment. The trigger signal may be transmitted over a communication medium that may comprise one or more signal lines. The communication medium may comprise additional elements such as drivers, buffers, and/or logic gates.

The first processor storage 1012 and the second processor storage 1014 are tangible, non-transitory storage. The non-transitory storage could be volatile or non-volatile. The first processor storage 1012 is used to store first instructions that are executed by the first processor 1002. The first processor storage 1012 may also be used to store parameters that the first processor 1002 applies when executing the first instructions. The second processor storage 1014 is used to store second instructions that are executed by the second processor 1004. The second processor storage 1014 may also be used to store parameters that the second processor 1004 applies when executing the second instructions.

In one embodiment, a copy of the first instructions (and possibly parameters used by first processor 1002) and a copy of the second instructions (and possibly parameters used by second processor 1004) are stored in non-volatile storage in order to persist the instructions (and possibly parameters) across power cycles. Those copies may be loaded into a volatile storage, which is accessed by the respective processors 1002, 1004. For example, the instruction loader 1030 may load a copy of the instructions (and possibly parameters) from the memory structure 126 into the first processor storage 1012 and the second processor storage 1014. Note that although the first processor storage 1012 and the second processor storage 1014 are depicted as within the microcontroller 112, the first processor storage 1012 and the second processor storage 1014 may reside outside of the microcontroller 112.

Note that the instructions and/or parameters in the first processor storage 1012 and/or parameters in the second processor storage 1014 can be modified to allow the operation of the first processor 1002 and/or second processor 1004 to be modified. For example, the instructions which the first processor executes could be modified to change the timing of applying voltages to the memory structure 126. For example, the instructions which the second processor executes could be modified to change conditions for sensing the non-volatile memory cells. In some cases, parameters could be modified to, for example, change the magnitude of voltages that are applied to word lines, select lines, etc.

The instruction updater 1032 may be used to update instructions stored in the first processor storage 1012 and the second processor storage 1014. Note that the instruction updater 1032 might update a version of the instructions that are stored in the memory structure 126, with the instruction loader 1030 loading those instructions after a power reset. The instruction updater 1032 may also update parameters that are used when executing the instructions.

The first processor 1002 and second processor 1004 are able to fetch, decode, and execute instructions from their respective processor storage (1012, 1014), in one embodiment. The first processor 1002 and second processor 1004 can be implemented as microprocessors, in one embodiment. A microcontroller 112 may comprise one or more processors that process and/or execute microcode or other computer executable code (e.g., an instruction set) to perform tasks or operations. The first processor 1002 and second processor 1004 may each comprise elements such as of flip flops, latches, RAM/ROM, combinational logic, etc. In one embodiment, first processor 1002 and second processor 1004 are implemented using CMOS technology. The Microcontroller 112 is positioned on the substrate underneath the memory array, in one embodiment. The Microcontroller 112 resides on the same memory die as the memory structure 126, in one embodiment. The Microcontroller 112 resides on the same memory die as the memory structure 126, first circuit 1020, and second circuit 1022, in one embodiment.

The instruction loader 1030 and the instruction updater 1032 may take the form of packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each instruction loader 1030 and the instruction updater 1032 may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, instruction loader 1030 and the instruction updater 1032 may include or comprise software stored in a processor readable device (e.g., memory) to program a one or more processors to perform the functions described herein.

Figure 10B:
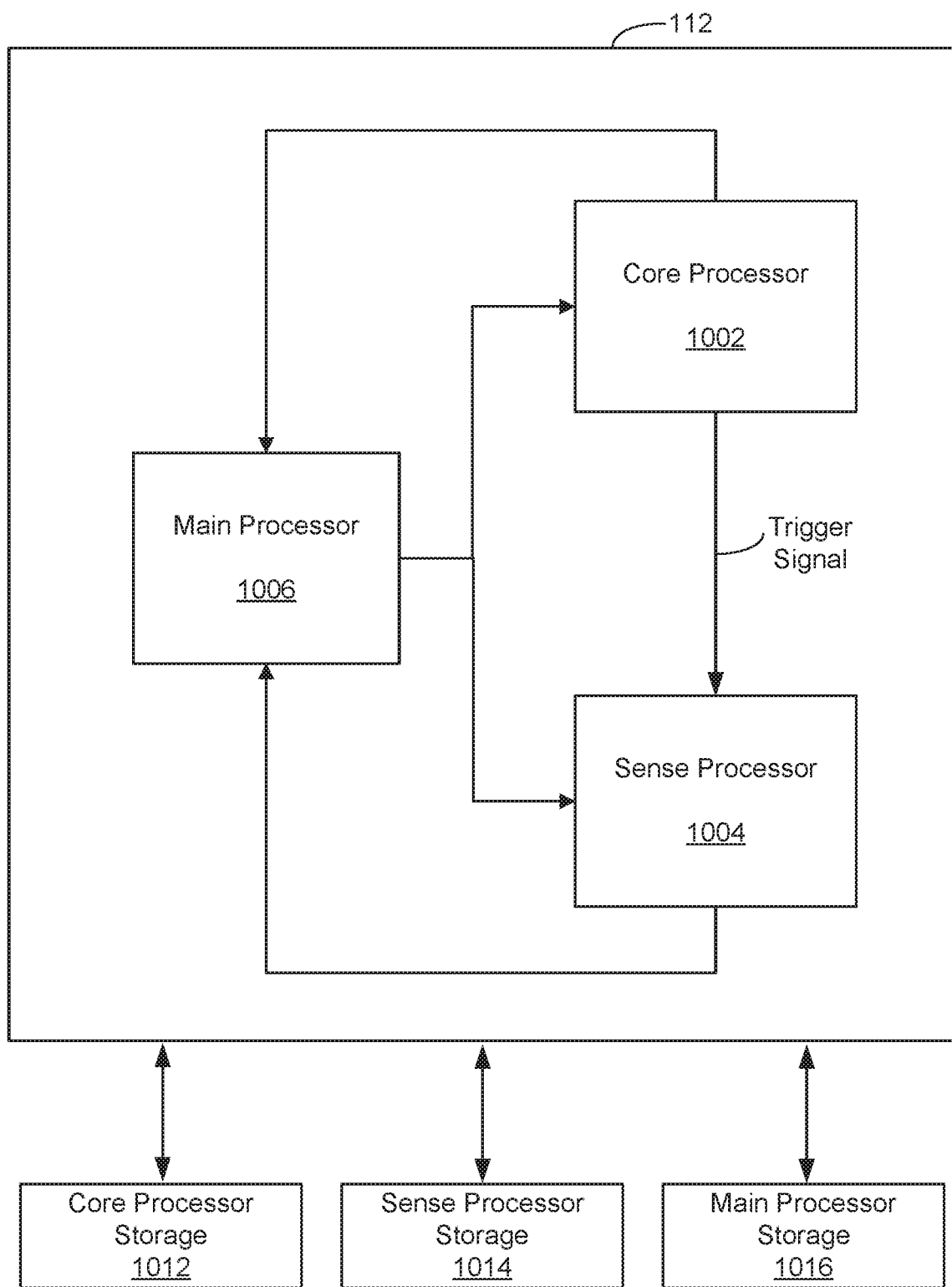
FIG. 10B is a high-level block diagram of one embodiment of microcontroller having three processors.

FIG. 10B is a high-level block diagram of one embodiment of microcontroller 112. The microcontroller 112 includes a Main Processor 1006, a Core Processor 1002, and a Sense Processor 1004. Also depicted is Core processor storage 1012, Sense processor storage 1014, and Main processor storage 1016.

The Core Processor 1002 is one embodiment of first processor 1002 in FIG. 10A. The Core Processor 1002 has access to Core processor storage 1012, in one embodiment. The Sense Processor 1004 is one embodiment of second processor 1004 in FIG. 10A. The Sense Processor 1004 has access to Sense processor storage 1014, in one embodiment. The Main Processor 1006 has access to Main processor storage 1016, in one embodiment. The Main processor storage 1016 may be used to store instructions executed by the Main processor 1006. The Main processor storage 1016 may also be used to store data (e.g., parameters), which may be applied by the Main Processor 1006.

The Main Processor 1006 may also be referred to as a Main Control Unit (MCU). The Main Processor 1006 provides algorithm flow control, such as steps in programming, reading, and erasing memory cells, in one embodiment. The Main Processor 1006 also calculates magnitudes of analog voltages, such as program voltages and read reference voltages, in one embodiment.

The Main Processor 1006 is a master, with the Core Processor 1002 and the Sense Processor 1004 being slaves to the Main Processor 1006, in one embodiment. The Main Processor 1006 may direct the Core Processor 1002 to execute selected instructions in first processor storage 1012 to coordinate sequences of voltages applied to the memory structure 126 by the first circuit 1020 for a particular memory operation. The Core Processor 1002 directs the Sense Processor 1004 to execute selected instructions in the second processor storage 1014 to control the second circuit 1022 to test conditions of a group of the non-volatile memory cells for the particular memory operation, in one embodiment. The Core Processor uses the Trigger Signal to cause the Sense Processor 1004 to execute the selected instructions in the second processor storage 1014, in one embodiment. The trigger signal may be an analog or digital signal. The trigger signal allows the Core Processor 1002 to control when to test the conditions relative to when voltages are applied to the memory structure 126. The trigger signal may be sent over a communication medium, which may comprise one or more signal lines. The communication medium may also comprise one or more driver(s), buffer(s), and/or logic gate(s).

The Core Processor 1002, the Sense Processor 1004, and the Main Processor 1006 are able to fetch, decode, and execute instructions from their respective processor storage (1012, 1014, 1016). The Core Processor 1002, the Sense Processor 1004, and the Main Processor 1006 can be implemented as microprocessors, in one embodiment. The Microcontroller 112 having the Core Processor 1002, the Sense Processor 1004, and the Main Processor 1006 is positioned on the substrate underneath the memory structure 126, in one embodiment.

Figure 11:
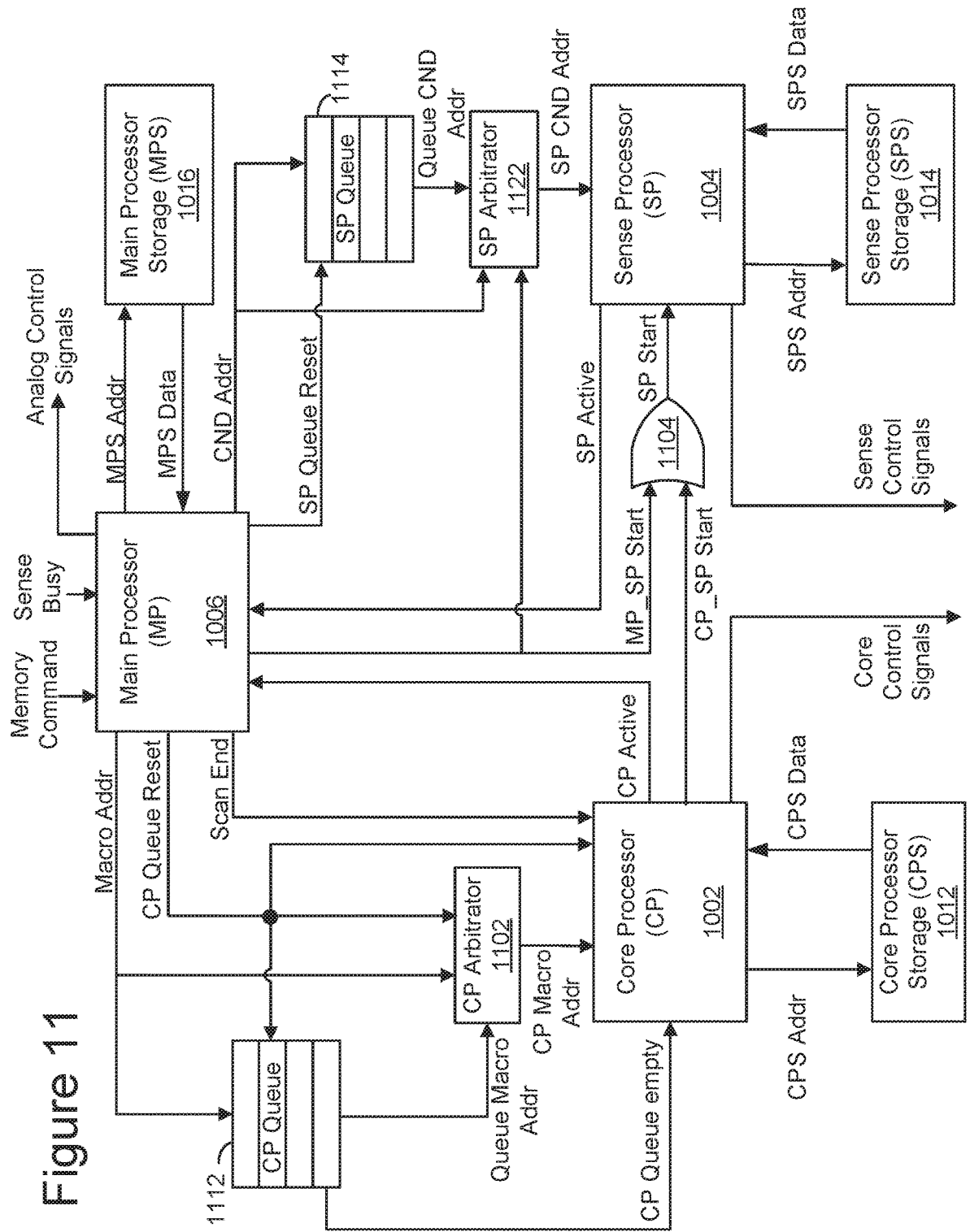
FIG. 11 is a more detailed block diagram of one embodiment of microcontroller.

FIG. 11 is a more detailed block diagram of one embodiment of microcontroller 112. FIG. 11 shows one embodiment in which microcontroller 112 includes Main Processor (MP) 1006, Core Processor (CP) 1002, and Sense Processor (SP) 1004, Core Processor Storage (CPS) 1012, Sense Processor Storage (SPS) 1014, Main Processor Storage (MPS) 1016, CP Arbitrator 1102, SP Arbitrator 1122, OR gate 1104, CP Queue 1112, and SP Queue 1114.

In one embodiment, the MP Storage 1016, CP Storage 1012, and the SP Storage 1014 are volatile memory (e.g., SRAM) and get loaded from the non-volatile memory 126 at power-on, in one embodiment. For example, the MP Storage 1016 gets loaded with a set of instructions for the Main Processor 1006, the CP Storage 1012 gets loaded with a set of instructions for the Core Processor 1002, and the SP Storage 1014 gets loaded with a set of instructions for the Sense Processor 1004. Note that information other than instructions (e.g., parameters) may also be loaded with one or more of the sets of instructions. In some cases, all or a portion of one or more of the storages 1012, 1014, and/or 1016 may be non-volatile, such that loading from the non-volatile memory 126 at power-on is not required.

In one embodiment, the non-volatile memory 126 that stores the instructions is updated by, for example, instruction updater 1032 (which may reside in controller 122). Note that host 140 may send instructions to the controller 122 to perform the update. Note that the microcontroller 112 may store the updated instructions to the non-volatile memory 126, in response to a command from the controller 122. The microcontroller 112 may then be power cycled to cause the instructions in the MP Storage 1016, CP Storage 1012, and the SP Storage 1014 to be updated. In one embodiment, the instructions in the MP Storage 1016, CP Storage 1012, and the SP Storage 1014 are directly updated by the controller 122. Note that some or all of the MP Storage 1016, CP Storage 1012, and/or the SP Storage 1014 could be formed from non-volatile memory. Note that this non-volatile memory is re-writeable such that the instructions can be updated, in one embodiment. Note that parameters may be updated in a similar manner as the instructions.

The Main Processor 1006 may receive a memory command such as program, read, erase, etc. The memory command may be provided by controller 122. The arrow between "Memory Command" and the Main Processor 1006 represents a communication medium, in one embodiment. Note that the various other arrows in FIG. 11 also represent communication media, in one embodiment. As noted herein, a communication medium may include a signal line. The labels next to an arrow refer to the name of a signal that may be transferred over a signal line. The Main Processor 1006 accesses instructions from MP Storage 1016 in order to control execution of the memory command (by controlling the Core Processor 1002 and the Sense Processor 1004). The Main Processor 1006 determines what set of instructions it needs to execute for the memory command. Note that MP Storage 1016 may contain more than one set of instructions for a read command, as there may be different modes of read operations. Likewise, the MP Storage 1016 may contain more than one set of instructions for a program operation, as there may be different modes of program operations (e.g., SLC, MLC, TLC, etc.). Note that, as the terms are used herein, SLC refers to storing a single bit per memory cell, MLC refers to storing two bits per memory cell, and TLC refers to storing three bits per memory cell. The Main Processor 1006 determines the addresses for the set of instructions it needs to execute for the memory operation, and accesses instructions at those addresses. Thus, Main Processor 1006 may send the addresses (MPS Addr) to MP Storage 1016, which responds by returning the instructions (MPS Data). Note that the Main Processor 1006 may also access parameters from MPS 1016. Note that "MPS Data" may include instructions that the Main Processor executes and to parameters or the like used by the Main Processor. The Main Processor 1006 then executes this set of instructions to control execution of the memory operation.

The Main Processor 1006 outputs "Analog Control Signals." As one example, the Analog Control Signals may be used to control at least some of the functionality of the voltage generator 1024. These Analog Control Signals may be used to specify magnitudes of analog voltages (e.g., programming voltages, read reference voltages). Note that the Analog Control Signals may themselves be analog or digital signals. The Analog Control Signals may be sent over a communication medium, which may comprise one or more signal lines. The communication medium may also comprise one or more driver(s), buffer(s), and/or logic gate(s).

The CP Queue 1112 may be used to store addresses or other identifiers of instructions in the CP Storage 1012. The CP Queue 1112 may also be referred to as a CP instruction queue. The SP Queue 1114 may be used to store addresses or other identifiers of instructions in the SP Storage 1014. The SP Queue 1114 may also be referred to as an SP instruction queue. The CP Queue 1112 and the SP Queue 1114 are each First-In First-Out (FIFO) queues, in one embodiment.

Main Processor 1006 may control the Core Processor 1002 and the Sense Processor 1004 by supplying instructions for those processors to execute. The Main Processor 1006 may supply the instructions by supplying addresses or other identifiers of the instructions to the CP Queue 1112 or SP Queue 1114. Thus, the Main Processor 1006 may also determine what instructions the Core Processor 1002 and Sense Processor 1004 should execute for the memory operation.

Thus, the Main Processor 1006 determines an algorithm flow for executing the memory command it receives from, for example the controller 122. Based on the algorithm flow, the Main Processor 1006 determines one or more macros to be executed by the Core Processor 1002, in one embodiment. Each macro is a set of instructions in the CP Storage 1012. Note the depending on the memory operation, there may be several macros for a single memory operation. In one embodiment, a macro can specify a CTC operation for the Core Processor 1002 to perform. A CTC operation may include to a sequence of voltages applied to the memory structure 126. For example, a CTC operation may include timing for voltages applied to a selected word line, unselected word lines, select lines, etc. The Main Processor 1006 sends an address or other identifier of the macro(s) (referred to as Macro Addr in FIG. 11) to the CP Queue 1112.

The Main Processor 1006 also determines one or more conditions for the Sense Processor 1004 to test, for the memory operation, in one embodiment. These conditions are connected to the CTC operations, in one embodiment. For example, the Main Processor 1006 may determine a condition for which the Sense Processor 1004 is to test for a specific CTC operation. The Main Processor 1006 determines a set of instructions in the SP Storage 1014 for the condition. The Main Processor 1006 sends an address or either identifier of the instructions (referred to as CND Addr in FIG. 11) to the SP Queue 1114.

The Core Processor 1002 is connected to the CP Queue 1112, the CP Arbitrator 1102, OR gate 1104, Main Processor 1006, and the CP Storage 1012. In one embodiment, the Core Processor 1002 executes the next instruction on the CP Queue 1112, whenever the CP Queue 1112 is not empty. The "CP Queue empty" signal may inform the Core Processor 1002 of whether there is another instruction on the CP Queue 1112, in one embodiment. Thus, the CP Queue 1112 may be triggered to start executing a macro (or other set of instructions) in response to the Main Processor 1006 placing, for example, an address of the macro on the CP Queue 1112. Core Processor 1002 may send the addresses (CPS Addr) to CPS Storage 1012, which responds by returning the instructions (CPS Data). Note that the Core Processor 1002 may output a set of Core Control Signals in response to executing the instructions. For example, the Core Processor 1002 may output a set of Core Control Signals for a CTC operation. These signals may control charge pumps, decoders, etc. to apply voltages to word lines, select lines, etc. These signals may control voltage generator 1024. Note that a given CTC operation may include applying a sequence of voltages having different magnitude to the same line (e.g., word line) as time progresses. For example, the magnitude of the voltage applied to the selected word line can change during the CTC operation.

The microcontroller 112 has a CP Arbitrator 1102. In the embodiment of FIG. 11, the CP Arbitrator 1102 is connected between the CP Queue 1112 and the Core Processor 1002. The CP Arbitrator 1102 can either supply the Core Processor 1002 a Macro address (or Macro identifier) from the CP Queue 1112, or an interrupt routine address or identifier (that is not on the CP Queue 1112). This allows the CP Arbitrator 1102 to supply the Core Processor 1002 with, for example, an address of an interrupt routine. Thus, the CP Arbitrator 1102 may be used for (controller or user/host) interrupts and power drops, after which CP Arbitrator 1102 sends a new instruction to the Core Processor 1002. The CP Arbitrator 1102 may also flush the CP Queue 1112 in response to an interrupt. In one embodiment of a soft interrupt occurrence, the CP Arbitrator 1102 selects a macro from CPS 1012, which is used for the interrupt. In an embodiment in which the Core Processor 1002 directly accesses the CP Queue 1112, the CP Arbitrator 1102 may place an address of an interrupt routine on the CP Queue 1112. Note that the Main Processor 1006 may also use the CP Queue Reset to flush the CP Queue 1112. Note that in FIG. 11 the information that the CP Arbitrator 1102 pulls from the CP Queue 1112 is referred to as "Queue Macro Addr," and the information that the CP Arbitrator 1102 supplies to the Core Processor 1002 is referred to a "CP Macro Addr."

The Sense Processor 1004 is connected to the Sense Processor Storage 1014, SP Arbitrator 1122, OR gate 1104, and Main Processor 1006. In one embodiment, the Sense Processor 1004 executes the next instruction (or set of instructions) on the SP Queue 1114 in response to the SP Start signal (which is an example of a trigger signal). Sense Processor 1004 may send the addresses (SPS Addr) to SPS Storage 1014, which responds by returning the instructions (SPS Data). The Core Processor 1002 may trigger the Sense Processor 1004 by issuing the CP_SP Start signal to the OR gate 1104. The Main Processor 1006 may trigger the Sense Processor by use of an MP_SP start signal to the OR gate 1104. In one embodiment, the Main Processor 1006 may over-ride the ability of the Core Processor 1002 to trigger the Sense Processor 1004. Thus, note that there is a hierarchy in which the Main Processor 1006 is a master to both the Core Processor 1002 and the Sense Processor 1004, and in which the Core Processor 1002 may execute some amount of control over the Sense Processor 1004.

Note that the Core Processor 1002 may trigger the Sense Processor 1004 to test for a certain condition with respect to a CTC operation that the Core Processor 1002 is executing. For example, the Core Processor 1002 may execute instructions for a CTC operation and output Core Control Signals for the CTC operation. The Core Processor 1002 may trigger the Sense Processor 1004 at a certain time to execute instructions to test for a condition of the memory cells with respect to the CTC operation.

The microcontroller 112 has an SP Arbitrator 1122, in this embodiment. In the embodiment of FIG. 11, the SP Arbitrator 1122 is connected between the SP Queue 1114 and the Sense Processor 1004. Note that in FIG. 11 the information that the SP Arbitrator 1122 pulls from the SP Queue 1114 is referred to as "Queue CND Addr," and the information that the SP Arbitrator 1122 supplies to the Sense Processor 1004 is referred to a "SP CND Addr." In one embodiment, the SP Arbitrator 1122 can either supply the Sense Processor 1004 with a CND address (or CND identifier) from the SP Queue 1114, or an interrupt routine address or identifier (that is not on the SP Queue 1114). This allows the SP Arbitrator 1122 to supply the Sense Processor 1004 with, for example, an address of an interrupt routine. Thus, the SP Arbitrator 1122 may be used for (controller or user/host) interrupts and power drops, after which SP Arbitrator 1122 sends a new instruction to the Sense Processor 1004. The SP Arbitrator 1122 may also flush the SP Queue 1114 in response to an interrupt. Note that the Main Processor 1006 may also use the SP Queue Reset to flush the SP Queue 1114. In one embodiment, the Main Processor 1006 issues the MP_SP_Start signal to trigger the Sense Processor 1004 to execute an interrupt routine that is identified on the SP Queue 1114.

Figure 12A:
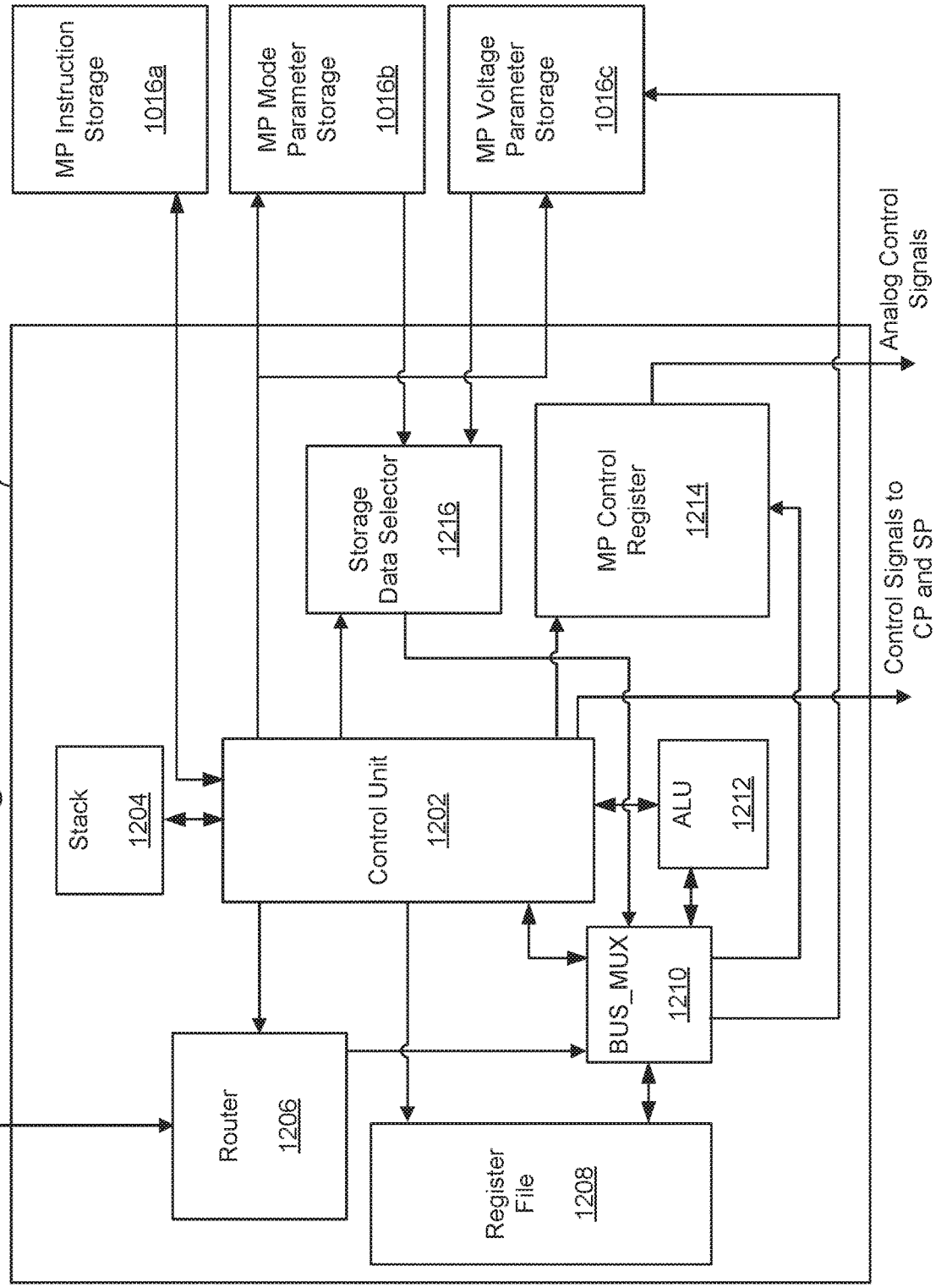
FIG. 12A is a block diagram of one embodiment of Main Processor, and MP Storage.

Note that the Core Processor 1002 may inform the Main Processor 1006 of whether it is active or not by use of "CP Active" Signal. Note that the Sense Processor 1004 may inform the Main Processor 1006 of whether it is active or not by use of "SP Active" Signal. Furthermore, note that the Main Processor 1006 receives a "Sense Busy" signal. The Sense Busy is provided by the sensing circuit 1026, in one embodiment. Thus, the sensing circuit 1026 is able to inform the Main Processor 1006 whether or not it is busy with a sensing operation, or the like. Finally, note that the Main Processor 1006 may send a "Scan End" signal to the Core Processor 1002. The Scan End signal indicates that the operation being controlled by the Sense Processor 1004 has completed. The Core Processor 1002 may determine when to send the next CP_SP_Start based on the Scan End signal. The Core Processor 1002 may also determine when to send additional control signals to the first circuit 1020, based on the Scan End signal. For example, in response to the sensing operation being over, the Core Processor 1002 may send control signals to remove voltages that were applied to the memory structure just prior to the sensing operation. FIG. 12A is a block diagram of one embodiment of Main Processor 1006 and MP Storage 1016. In this embodiment, the MP Storage 1016 is divided between MP Instruction Storage 1016a, MP Mode Parameter Storage 1016b, and MP Voltage Parameter Storage 1016c. The MP Instruction Storage 1016a may be used to store instructions that are executed by the control unit 1202. These instructions may provide an algorithm that the Main Processor 1006 performs to control execution of a memory command.

The MP Mode Parameter Storage 1016b may be used to store mode related parameters. Example "modes" are SLC, MLC, TLC, etc. Depending on the mode, the voltage magnitude may be different. For example, the read reference voltages for SLC (see FIG. 5A, for example) will be different than those for TLC (see FIG. 4, for example). Thus, the MP Mode Parameter Storage 1016b may store various parameters that may vary depending on the mode.

The MP Voltage Parameter Storage 1016c may be used to store parameters for operation of a Digital to Analog Converter (DAC) in voltage generator 1024. The storage Data Selector 1216 is used to select data from the MP Mode Parameter Storage 1016b and the MP Voltage Parameter Storage 1016c. The MP Voltage Parameter Storage 1016c may store parameters such as the step size (increment) in programming voltage from one program loop to the next. This may be used to calculate the increase in Vpgm in a programming process, such as in step 786 of the programming process of FIG. 5.

FIG. 12A shows a Control Unit (CU) 1202 connected to a stack 1204, a router 1206, a register file 1208, an arithmetic logic unit (ALU) 1212, MP Control Register 1214, Storage Data Selector 1216, a MP Instruction Storage 1016a, a MP Mode Parameter Storage 1016b, MP Voltage Parameter Storage 1016c, and BUS_MUX 1210. The various arrows in FIG. 12A refer to communication media, in one embodiment.

The control unit 1202 outputs control signals to the Core Processor 1002 and the Sense Processor 1004 (Core Processor 1002 and the Sense Processor 1004 are not depicted in FIG. 12A). Examples of these control signals were discussed in the discussion of FIG. 11. The control signals may identify instructions for the Core Processor 1002 and the Sense Processor 1004 to execute. With reference to FIG. 11, the control unit 1202 may be connected to the CP Queue 1112, CP Arbitrator 1102, Core Processor 1002, SP Queue 1114, SP Arbitrator 1122, Sense Processor 1004, as well as logic such as OR gate 1104.

The MP Control Register 1214 includes a set of registers for external signals "Analog Control Signals." As one example, the Analog Control Signals may be used to control at least some of the functionality of the voltage generator 1024. For example, the Analog Control Signals may control the magnitude of voltages output by drivers 550. The control unit 1202 may use the MP Control Register 1214 to issue control signals to control, for example, drivers 550. These control signals may be used to specific magnitude of analog voltages (e.g., programming voltages, read reference voltages).

The ALU 1212 performs arithmetic and logical operations. The control unit 1202 uses the ALU 1212 to determine magnitudes for analog voltages (e.g., programming voltages, read reference voltages). As one example, the program voltage may increase by a certain increment each loop. This increment may be a parameter in the MP Voltage Parameter Storage 1016c. Note that the value of a parameter such as this can easily be changed by modifying the value stored in MP Voltage Parameter Storage 1016c. Note that for some architectures, the value of such a parameter may be hard-coded, such that it is very difficult to modify.

When the controller 122 sends a memory command to the Main Processor 1006, the memory command is first processed by router 1206. The router 1206 divides the memory operations based on the type of memory operation, such as program, read, erase, in one embodiment. The router 1206 includes a MUX to route the memory operations, in one embodiment. Based on the memory command, the control unit 1202 fetches, decodes and executes the instruction from MP Instruction Storage 1016a. The stack 1204 is used to store temporary program counter (pc) address with a Last In First Out (LIFO) mechanism during program execution. The Register File 1208 may be used for temporary storage locations to hold data and addresses.

Note that the MP Mode Parameter Storage 1016b and the MP Voltage Parameter Storage 1016c may share the same bus. The Storage Data Selector 1216 may be used to select between the MP Mode Parameter Storage 1016b and the MP Voltage Parameter Storage 1016c. There may be a separate bus for the MP Instruction Storage 1016a for high performance. Note that the BUS_MUX 1210 may act as a MUX for the Register File 1208, Router 1206 to access the MP Mode Parameter Storage 1016b and the MP Voltage Parameter Storage 1016c.

Figure 12B:
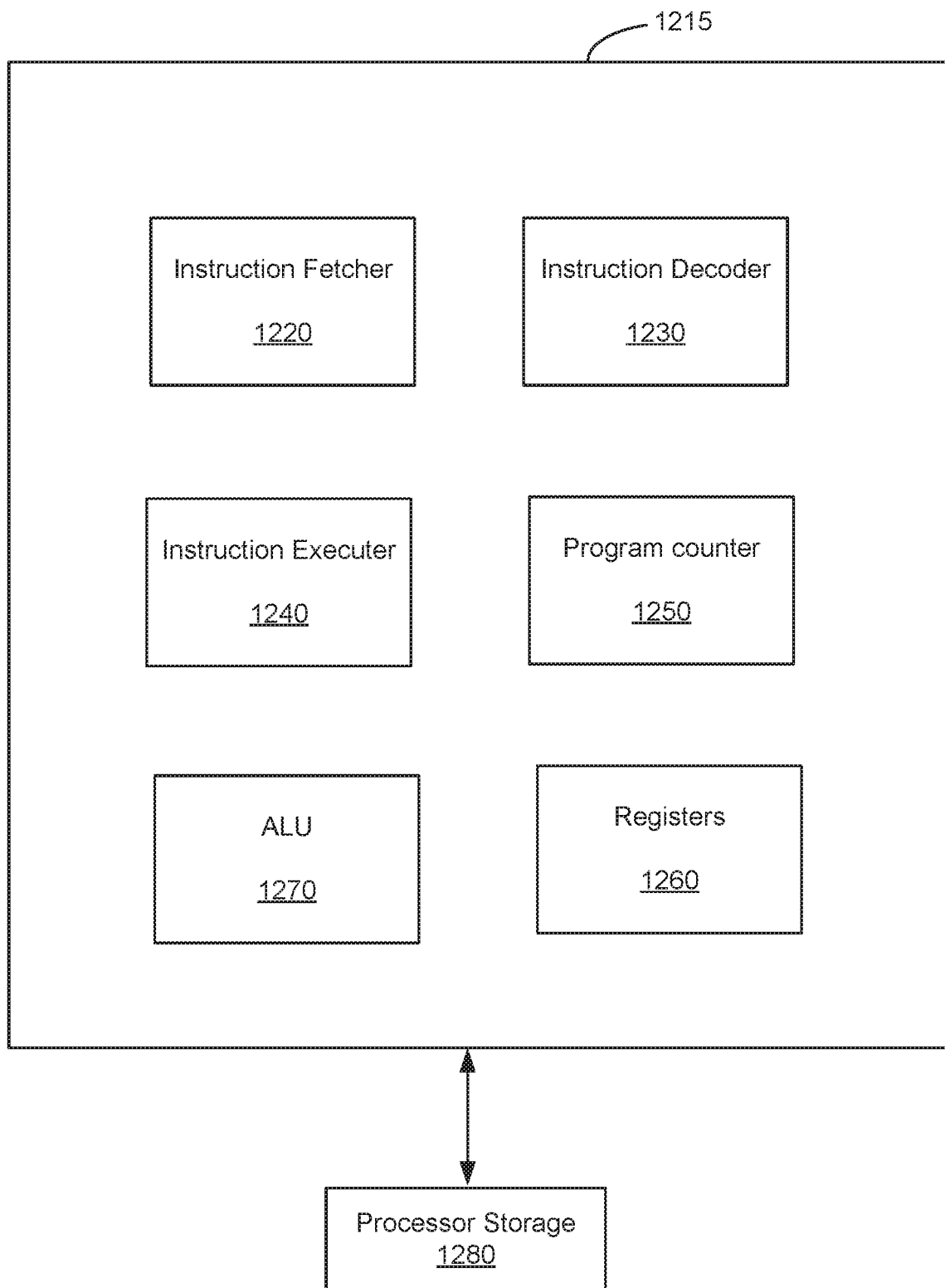
FIG. 12B is a diagram of one embodiment of a processor that may be used to implement a Core Processor, a Sense Processor, or a Main Processor.

FIG. 12B is a diagram of one embodiment of a processor 1215. Processor 1215 may be used to implement the core processor 1002 or the sense processor 1004. In one embodiment, the processor 1215 is used to implement main processor 1006. The processor storage 1280 could be core processor storage 1012, sense processor storage 1014, or main processor storage 1016. Processor 1215 has a program counter 1250 that may be used to store the address of an instruction in processor storage 1280. The instruction fetcher 1220 is configured to fetch an instruction identified by the program counter 1250 from the processor storage 1280. The instruction decoder 1230 is configured to decode the instruction. The instruction has an operation code (opcode), in one embodiment. Note that the core processor 1002, the sense processor 1004, and the main processor 1006 may each have different instruction sets. The instruction executer 1240 is configured to execute the decoded instructions. The registers 1260 may be used for temporary storage of parameters. The ALU 1270 is optional for the core processor 1002 and the sense processor 1006, in one embodiment. In one embodiment, the main processor 1006 has an ALU 1270. The elements in processor 1215 may comprise, but are not limited to, one or more of a microprocessor, an electrical circuit, an application specific integrated circuit (ASIC), a Field Programmable Gate Array (FPGA), a digital logic circuit, an analog circuit, gates, flip flops, latches, RAM/ROM, and/or combinational logic.

Figure 13:
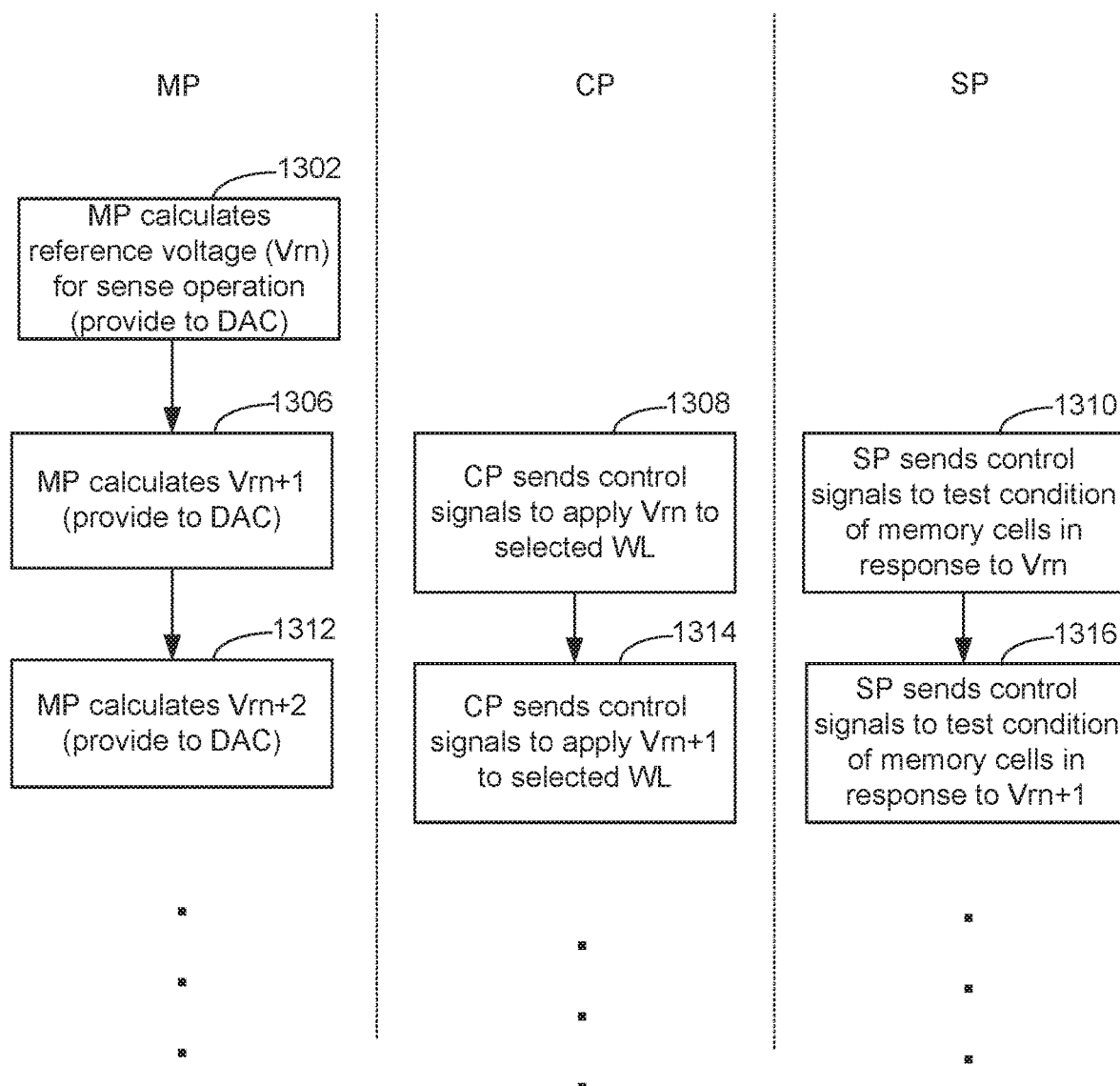
FIG. 13 is a flowchart of one embodiment of a process of a microcontroller reading non-volatile memory cells.

FIG. 13 is a flowchart of one embodiment of a process 1300 of a microcontroller 112 controlling execution of reading non-volatile memory cells. The process 1300 provides further details for actions performed by the microcontroller 112 during one embodiment of the process of FIG. 8 or 9. Process 1300 is greatly simplified, and does not show all actions performed by microcontroller 112 during a read operation. The process 1300 may be initiated in response to the Main Processor 1006 receiving a read command from controller 122. The process 1300 may also be used for a verify operation in a programming process. Process 1300 shows how the various processors 1002, 1004, 1006 can work in parallel during one embodiment of a read operation. The process 1300 is divided into steps 1302, 1306, and 1312 performed by the Main Processor 1006, steps 1308, 1314 performed by the Core Processor 1002, and steps 1310, 1316 performed by the Sense Processor 1004. Note that steps 1306, 1308, and 1310 may be performed in parallel. Likewise, steps 1312, 1314, and 1316 may be performed in parallel.

Step 1302 includes the Main Processor 1006 calculating a reference voltage (e.g., Vrn) for a sense operation. Note that a read or verify operation may involve multiple reference voltages. For example, in FIG. 4, there are seven read reference voltages (Vr1-Vr7) and seven verify voltages. Also note that the references voltages do not necessarily stay fixed throughout the lifetime of the memory device. For example, the read reference voltages (Vr1-Vr7) can be "dynamic" in that the levels can be shifted over time to accommodate for factors such as shifts in threshold voltage distributions due to, for example, charge loss, program disturb, and/or read disturb. Note that the reference voltage will be applied to the word line that is selected for reading, in one embodiment. The Main Processor 1006 could also determine magnitudes for other voltages. For example, the Main Processor 1006 could also determine magnitudes for voltages to be applied to unselected word lines. The Main Processor 1006 could also determine magnitudes for voltages for other lines, such as select lines (e.g., SGS, SGS).

In some cases, the magnitudes of the voltages (e.g., for the selected WL, unselected WL, select lines) may be location dependent. For example, voltage magnitudes could depend on which block is selected. The voltage magnitudes could depend on which word line is selected for sensing. The voltage magnitude for an unselected word line could depend on the location of the unselected word line relative to the selected word line.

Step 1302 may also include the Main Processor 1006 providing the magnitude of one or more voltages to the voltage generator 1024. For example, the Main Processor 1006 provides the magnitude of a read reference voltage to a DAC, such that a word line driver is able to generate the proper magnitude voltage for the read reference voltage. However, another option is to provide the magnitudes later in the process 1300.

As mentioned above steps 1306, 1308, and 1310 may be performed in parallel. Thus, in step 1306 the Main Processor 1006 may calculate the magnitude for the next reference voltage Vrn+1. The Main Processor 1006 may determine magnitudes one or more other voltages in step 1306. This step may be similar to step 1302, but is for the next reference voltage Vrn+1.

Step 1308 includes the Core Processor 1002 sending control signals to the voltage generator 1024 to control the timing of the voltages applied to the memory structure. This may include controlling the timing of applying the reference voltage and any other voltages calculated by the Main Processor 1006 for Vrn. With reference to FIG. 8, the control signals sent by the Core Processor 1002 may result in pass voltages being applied to unselected word lines (step 800) and the read reference voltage being applied to the selected word line (step 802). With reference to FIG. 9, the control signals sent by the Core Processor 1002 may result in pass voltages being applied to unselected word lines (step 902) and the read reference voltage being applied to the selected word line (step 904).

Step 1310 includes the Sense Processor 1004 sending control signals to test a condition of the memory cells on the selected word line in response to Vrn being applied to the selected word line (along with other voltages applied to unselected word lines, select lines etc. In one embodiment, the control signals sent by the Sense Processor 1004 control the sensing circuit 1026. The control signals may control data latch processor 192, which may control data latches 194 as discussed in the description of FIG. 1B. Note that steps 1308 and 1310 may result in the Sense Processor 1004 causing the reference voltage to be applied to the selected word line while the Sense Processor 1004 detects the condition of the group during the present sensing phase.

In one embodiment, the control signals sent by the Sense Processor 1004 may result in controlling transistors in a sense amplifier. Thus, in one embodiment, the control signals sent by the Sense Processor 1004 control transistors in a sense amplifier to pre-charge bit lines (step 804 in FIG. 8), and allow bit lines to discharge (step 806 in FIG. 8). In one embodiment, the control signals sent by the Sense Processor 1004 may result in sensing with the sense amplifier after the integration time (step 808 in FIG. 8).

Thus, in step 1308 the Core Processor 1002 may execute a first set of instructions to control when a reference voltage is applied to the selected word line and when voltages are applied to unselected word lines during a present sensing phase of a group of the non-volatile memory cells. In step 1310, the Sense Processor 1004 may execute a second set of instructions to detect a condition of the group during the present sensing phase. In one embodiment, the Sense Processor 1004 executes the second set of instructions in response to a trigger signal (e.g., CP_SP Start) from the Core Processor 1002. In step 1306, the Main Processor 1006 may execute a third set of instructions to calculate a magnitude for the reference voltage for the selected word line for a sensing phase that immediately follows the present sensing phase.

Moreover, the Core Processor 1002 may execute the first set of instructions while the Sense Processor 1004 executes the second set of instructions. Note that this means that there is some overlap in time in the execution of the first and second sets of instructions. Also, the Main Processor 1006 may execute the third set of instructions while the Core Processor 1002 executes the first set of instructions and while the Sense Processor 1004 executes the second set of instructions. Note that this means that there is some overlap in time in the execution of the first, second, and third sets of instructions.

Steps similar to 1306, 1308, and 1310 may be performed for other reference voltages. Steps 1312, 1314, and 1316 are shown to depict the Main Processor calculating Vrn+2; while the Core Processor 1004 sends control signals to apply Vrn+1 to the selected word line, and the Sense Processor 1004 sends control signals to test a condition of the memory cells in response to Vrn+1. The processing can go on in a similar manner for other reference voltages.

Figure 14:
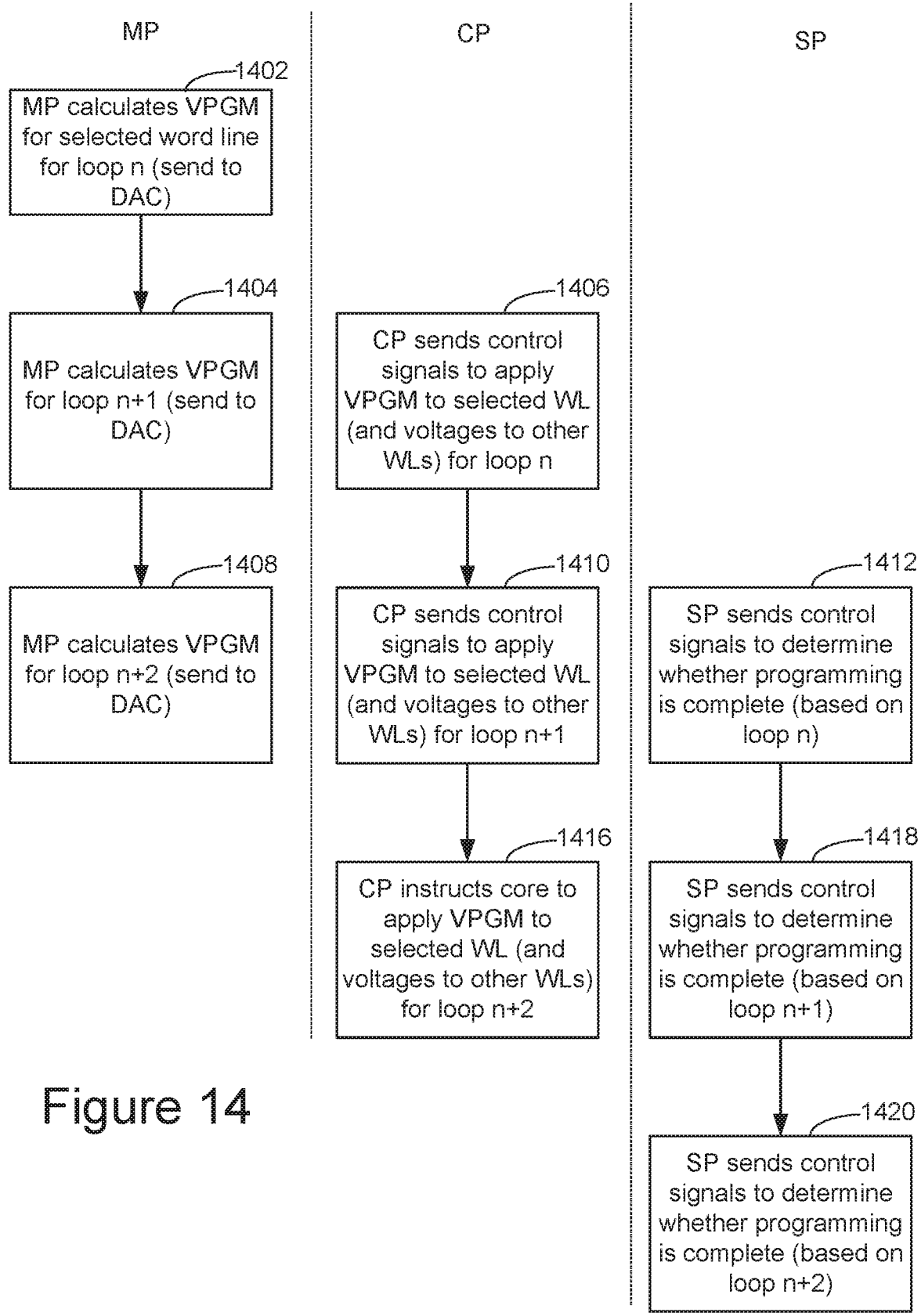
FIG. 14 is a flowchart of one embodiment of a process of a microcontroller programming non-volatile memory cells

FIG. 14 is a flowchart of one embodiment of a process 1400 of a microcontroller 112 programming a group of non-volatile memory cells. The process 1400 provides further details for actions performed by the microcontroller 112 during one embodiment of the programming process of FIG. 5. Process 1400 is greatly simplified, and does not show all actions performed by microcontroller 112 during a program operation. The process 1400 may be initiated in response to the Main Processor 1006 receiving a program command from controller 122. The program command may specify a group of non-volatile memory cells to program. In one embodiment, the word line to which control gates of memory cells in the group is connected is referred to as a selected word. Process 1400 shows how the various processors 1002, 1004, 1006 can work in parallel during one embodiment of a program operation. The process 1400 is divided into steps 1402, 1404, and 1408 performed by the Main Processor 1006; steps 1406, 1410, and 1416 performed by the Core Processor 1002; and steps 1412, 1418, and 1420 performed by the Sense Processor 1004. Note that steps 1408, 1410, and 1412 may be performed in parallel by all three processors 1002, 1004, 1006. Steps 1402 and 1406 may be performed in parallel by the Main Processor 1006 and the Core Processor 1002. Steps 1416 and 1418 may be performed in parallel by the Core Processor 1002 and the Sense Processor 1004. Note that process 1400 described actions for three program loops (n, n+1, and n+2); however, there could be more or fewer program loops.

Step 1402 includes the Main Processor 1006 calculating a program voltage (e.g., Vpgm) for a program operation. Note that the magnitude of the program voltage can depend on the program loop. For example, in FIG. 5, the magnitude of the program voltage can be incremented in step 786. Note that the program voltage will be applied to the word line that is selected for programming, in one embodiment. The Main Processor 1006 could also determine magnitudes for other voltages. For example, the Main Processor 1006 could also determine magnitudes for voltages to be applied to unselected word lines. These voltages may be referred to as "boosting voltages." Note that in FIG. 7, such boosting voltages are referred to as "Vpass." The Main Processor 1006 could also determine magnitudes for voltages for other lines, such as select lines.

In some cases, the magnitudes of the voltages may be location dependent. For example, the voltage magnitude for Vpass for an unselected word line could depend on the location of the unselected word line relative to the selected word line. In some cases, the magnitudes of the voltages may be temperature dependent.

Step 1402 may also include the Main Processor 1006 providing the magnitude of Vpgm (and other voltages) to the circuitry (e.g., voltage generator 1024) that generates the voltages. For example, the Main Processor 1006 provides the magnitude of Vpgm and Vpass to a DAC, such that word line drivers are able to generate the proper magnitude voltage for Vpgm and Vpass.

As mentioned above steps 1404 and 1406 may be performed in parallel. Thus, in step 1404 the Main Processor 1006 may calculate the magnitude for the program voltage for the next program loop. The Main Processor 1006 may determine magnitudes one or more other voltages in step 1404. This step may be similar to step 1402, but is for the next program loop n+1.

Step 1406 includes the Core Processor 1002 sending control signals to control the timing of the voltages applied to the memory structure. These control signals are sent to voltage generator 1024, in one embodiment. Step 1406 may include controlling the timing of applying the program voltage and any other voltages calculated by the Main Processor 1006 for Vrn. Step 1406 may include controlling the timing of applying the boost voltages (e.g., Vpass) to unselected word lines. With reference to FIG. 7, the control signals sent by the Core Processor 1002 may result in the voltage signals being applied to the selected WL, the unselected WL, SGD, SGS, and possible the bit line (BL). Note that it is not required that the Main Processor 1006 calculate the magnitude for all of those voltages in FIG. 7.

As mentioned above steps 1408, 1410, and 1412 may be performed in parallel. Thus, in step 1408 the Main Processor 1006 may calculate the magnitude for the program voltage for the next program loop (n+2). This step may be similar to steps 1402 and 1404, but is for program loop n+2. Note that the Main Processor 1006 executes instructions to determine the magnitudes.

Step 1410 includes the Core Processor 1002 sending control signals to control the timing of the voltages applied to the memory structure. This step may be similar to step 1406 but is for program loop n+1. Note that the Core Processor 1002 executes instructions to generate the control signals.

Step 1412 includes the Sense Processor 1004 sending control signals to determine whether programming is complete based on loop n. These control signals may be sent to sensing circuit 1026. This step is one example of determining whether a group of memory cells has passed a programming threshold. Note that the Sense Processor 1004 executes instructions to generate the control signals. In one embodiment, the Sense Processor 1004 executes the instructions in response to a trigger signal (e.g., CP_SP Start) from the Core Processor 1002. Further note that the Main Processor is executing instructions for loop n+2 (in step 1408) while the Core Processor is executing instructions for loop n+1 (in step 1410) and while the Sense Processor is executing instructions for program loop (in step 1412). Thus, while the Core Processor is executing instructions for a present program loop (e.g., loop n+1), the Main Processor may be executing instructions for a subsequent program loop (e.g., loop n+2) to immediately follow the present program loop, while the Sense Processor is executing instructions for a program loop (e.g., loop n) that immediately precedes the present program loop.

Also, note that steps 1406 and 1410 may be performed during one iteration of step 772 in FIG. 5. After step 772, a verification process may be performed in step 774. This verification process may be performed in a similar manner to the sensing operation of FIG. 13. Thus, the three processors 1002, 1004, 1006 may be used in parallel during step 774, as described in FIG. 13. However, that parallel processing is distinct from the parallel processing in FIG. 14. After step 776, there are several steps that determine whether programming is complete. For example, in step 780 a count is made of the number of memory cells that did not yet pass programming. Step 782 is a determination of whether programming is done, based on the count of step 780. Note that in one embodiment, the Sense Processor 1004 is performing the count of step 780 for one program loop (e.g., loop n) while the Core Processor 1002 is controlling the circuits that apply Vpgm for the next program loop (e.g., loop n+1), and while the Main Processor 1006 is determining Vpgm for loop n+2.

A first embodiment includes an apparatus, comprising: a memory structure comprising non-volatile memory cells; a first processor configured to execute first instructions to coordinate sequences of voltages applied to the memory structure by a first circuit in order to perform memory operations with respect to the non-volatile memory cells; and a second processor configured to execute second instructions in response to a trigger signal from the first processor to control a second circuit to test conditions of the non-volatile memory cells in response to the voltages applied to the memory structure.

In a second embodiment, and furtherance to the first embodiment, the apparatus further comprises a third processor configured to: direct the first processor to execute a first set of the first instructions to coordinate sequences of voltages applied to the memory structure by the first circuit for a particular memory operation; and direct the second processor to execute a second set of the second instructions to control the second circuit to test a condition of a group of the non-volatile memory cells for the particular memory operation.

In a third embodiment, and furtherance to the first or second embodiments, the apparatus further comprises a first instruction queue configured to hold identifiers of the first instructions. The first processor is further configured to execute a first set of the first instructions pointed to by an identifier on the first instruction queue whenever the first instruction queue is not empty.

In a fourth embodiment, and furtherance to any of the first to third embodiments, the apparatus further comprises a second instruction queue configured to hold identifiers of the second instructions. The second processor is further configured to execute a second set of the second instructions pointed to by an identifier on the second instruction queue in response to the trigger signal from the first processor.

In a fifth embodiment, and furtherance to any of the first to fourth embodiments, the apparatus further comprises a third processor configured to supply first identifiers of the first set of the first instructions to the first processor; and supply second identifiers of the second set of the second instructions to the second processor.

In a sixth embodiment, and furtherance to any of the first to fifth embodiments, the apparatus further comprises an arbitrator configured to: flush all identifiers on the second instruction queue in response to an interrupt; and place an identifier of an interrupt routine on the second instruction queue in response to the interrupt after the second instruction queue has been flushed, wherein the second processor is further configured to execute the interrupt routine identified on the second instruction queue in response to a control signal from the third processor.

In a seventh embodiment, and furtherance to any of the first to sixth embodiments, the apparatus further comprises an arbitrator configured to: flush all identifiers on the first instruction queue in response to an interrupt; and place an identifier of an interrupt routine on the first instruction queue in response to the interrupt after the first instruction queue has been flushed.

In an eighth embodiment, and furtherance to any of the first to seventh embodiments, the apparatus further comprises first non-volatile memory that stores the first instructions; second non-volatile memory that stores the second instructions; and an instruction updater configured to modify a portion of the first instructions in the first non-volatile memory, and to modify a portion of the second instructions in the second non-volatile memory.

In a ninth embodiment, and furtherance to any of the first to eighth embodiments, the apparatus further comprises a first instruction re-writeable memory; a second instruction re-writeable memory; and an instruction loader configured to load the first instructions from the first non-volatile memory to the first instruction re-writeable memory and to load the second instructions from the second non-volatile memory to the second instruction re-writeable memory, wherein the first processor is further configured to access the first instructions from the first instruction re-writeable memory. The second processor is configured to access the second instructions from the second instruction re-writeable memory.

In a tenth embodiment, and furtherance to any of the first to ninth embodiments, the first processor and the second processor reside in a substrate under the memory structure.

One embodiment includes a system comprising a memory die comprising non-volatile memory cells, a plurality of word lines connected to the non-volatile memory cells and a microcontroller connected to the word lines, the microcontroller comprising a first processor and a second processor. The first processor configured to execute a first set of instructions to control timing of a program voltage applied to a selected word line and timing of boost voltages applied to unselected word lines during a present program loop of a group of the non-volatile memory cells. The second processor is configured to execute a second set of instructions to count a number of non-volatile memory cells in the group that have not passed a programming threshold for a program loop that immediately precedes the present program loop. The second processor is configured to execute the second set of instructions while the first processor executes the first set of instructions.

One embodiment includes a system comprising a system comprising: a memory array comprising non-volatile memory cells and a plurality of word lines coupled to the non-volatile memory cells; a microcontroller comprising a first processor, a second processor, and a third processor. The first processor is configured to execute a first set of instructions to control when a reference voltage is applied to a selected word line and when voltages are applied to unselected word lines during a present sensing phase of a group of the non-volatile memory cells. The second processor is configured to execute a second set of instructions to sense the group during the present sensing phase, the second processor configured to execute the second set of instructions while the first processor executes the first set of instructions. The third processor is configured to execute a third set of instructions to calculate a magnitude for the reference voltage for the selected word line for a sensing phase of the group that immediately follows the present sensing phase. The third processor is configured to execute the third set of instructions while the first processor executes the first set of instructions and while the second processor executes the second set of instructions.

One embodiment includes an apparatus comprising: a memory die comprising a memory structure, the memory structure comprising non-volatile memory cells, a plurality of word lines coupled to the non-volatile memory cells, a select line associated with the non-volatile memory cells, and sense amplifiers associated with the non-volatile memory cells; first storage means for storing a first set of instructions; second storage means for storing a second set of instructions; third storage means for storing a third set of instructions; first processing means for executing the first set of instructions to generate control signals to control timing of voltages applied to the plurality of word lines and the select line; second processing means for executing the second set of instructions in response to a trigger signal from the first processing means to generate control signals to the sense amplifiers to determine a data state of ones of the non-volatile memory cells in response to the voltages applied to the plurality of word lines and the select line; and third processing means for executing the third set of instructions to supply first addresses of the first set of instructions in the first storage means to the first processing means, the third processing means further for executing the third set of instructions to supply second addresses of the second set of instructions in the second storage means to the second processing means.

In one embodiment, the first storage means for storing a first set of instructions comprises one or more of first processor storage 1012, core processor storage 1012, SRAM, non-volatile memory cells, instruction loader 1030, instruction updater 1032, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the first storage means could include other hardware and/or software.

In one embodiment, the second storage means for storing a second set of instructions comprises one or more of second processor storage 1014, sense processor storage 1014, SRAM, non-volatile memory cells, instruction loader 1030, instruction updater 1032, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the first storage means could include other hardware and/or software.

In one embodiment, the third storage means for storing a third set of instructions comprises one or more of Main processor storage 1016, MP Instruction Storage 1016a, MP Mode Parameter Storage 1016b, MP Voltage Parameter Storage 1016c, SRAM, non-volatile memory cells, instruction loader 1030, instruction updater 1032, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the first storage means could include other hardware and/or software.

In one embodiment, the first processing means for executing the first set of instructions to generate control signals to control timing of voltages applied to the plurality of word lines and the select line comprises one or more of first processor 1002, core processor 1002, a microprocessor, instruction fetcher 1220, program counter 1250, instruction decoder 1230, instruction executer 1240, registers 1260, ALU 1270, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the first processing means could include other hardware and/or software.

In one embodiment, the second processing means for executing the second set of instructions to generate control signals to the sense amplifiers to test conditions of the non-volatile memory cells in response to the voltages applied to the plurality of word lines and the select line comprises one or more of second processor 1004, sense processor 1004, a microprocessor, instruction fetcher 1220, program counter 1250, instruction decoder 1230, instruction executer 1240, registers 1260, ALU 1270, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the second processing means could include other hardware and/or software.

In one embodiment, the third processing means for executing the third set of instructions to supply first addresses of the first set of instructions in the first storage means to the first processing means, the third processing means further for executing the third set of instructions to supply second addresses of the second set of instructions in the second storage means to the second processing means comprises one or more of main processor 1006, a microprocessor, instruction fetcher 1220, program counter 1250, instruction decoder 1230, instruction executer 1240, registers 1260, ALU 1270, an electrical circuit, an application specific integrated circuit (ASIC), a Field Programmable Gate Array (FPGA), a digital logic circuit, an analog circuit, a combination of discrete circuits, gates, and/or a portion of a program code (e.g., software or firmware) executable by a (micro)processor or processing circuitry (or one or more processors). However, the third processing means could include other hardware and/or software.

One embodiment includes a method comprising: executing a first set of instructions on a first processor in a microcontroller on a memory die in response to a request to perform a memory operation on a group of non-volatile memory cells on the memory die, the first set of instructions configured to direct a second processor in the microcontroller to a second set of instructions, and direct a third processor in the microcontroller to a third set of instructions; executing the second set of instructions on the second processor, including issuing control signals to control timing of voltages applied to the group of the non-volatile memory cells for the memory operation; and executing the third set of instructions on the third processor in response to a trigger signal from the second processor, including issuing control signals to a sensing circuit to store information into data latches associated with ones of the non-volatile memory cells in response to sensing ones of the group of non-volatile memory cells for the memory operation.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A system comprising:
a memory structure comprising non-volatile memory cells and a plurality of word lines coupled to the non-volatile memory cells;
a first circuit configured to apply voltages to the memory structure;
a second circuit configured to sense the non-volatile memory cells in response to the voltages applied to the memory structure;
a microcontroller comprising a first processor, a second processor, and a third processor;
the first processor configured to execute a first set of instructions to control when the first circuit applies a reference voltage to a selected word line and when the first circuit applies pass voltages to unselected word lines during a present sensing phase of a sense operation of a group of the non-volatile memory cells;
the second processor configured to execute a second set of instructions to control the second circuit to sense the group during the present sensing phase, the second processor configured to execute the second set of instructions while the first processor executes the first set of instructions; and
the third processor configured to execute a third set of instructions to calculate a magnitude for the reference voltage for the selected word line for a sensing phase of the sense operation that immediately follows the present sensing phase, the third processor configured to execute the third set of instructions while the first processor executes the first set of instructions and while the second processor executes the second set of instructions.

2. The system of claim 1, wherein the first processor is configured to execute the first set of instructions to generate one or more control signals to cause the first circuit to apply the reference voltage to the selected word line during the present sensing phase of the sense operation while the second processor executes the second set of instructions to control the second circuit to sense the group during the present sensing phase of the sense operation.

3. The system of claim 1, wherein the first circuit comprises:
one or more voltage generators coupled to the non-volatile memory cells, wherein the first processor is configured to generate control signals to cause the one or more voltage generators to apply the reference voltage to the selected word line and pass voltages to the unselected word lines for the present sensing phase.

4. The system of claim 1, wherein the second circuit comprises:
a sensing circuit coupled to the non-volatile memory cells, wherein the second processor is configured to generate control signals to cause the sensing circuit to test conditions of selected memory cells in response to the reference voltage applied to the selected word line during the present sensing phase.

5. The system of claim 1, wherein the first circuit comprises a voltage generator, wherein:
the third processor is configured to calculate a magnitude for the reference voltage for the selected word line for the present sensing phase and to provide the magnitude for the reference voltage for the selected word line for the present sensing to the voltage generator; and
the first processor is configured to issue control signals to the voltage generator to control when the reference voltage for the present sensing phase is provided to the selected word line.

6. The system of claim 1, wherein:
the first processor is configured to issue a trigger signal to the second processor during the present sensing phase; and
the second processor is configured to execute the second set of instructions to sense the group during the present sensing phase in response to the trigger signal from the first processor.

7. The system of claim 1, wherein:
the sense operation is a read operation;
the third processor is configured to receive a command from a memory controller to perform the read operation; and
the third processor is further configured to control a flow of the read operation by specifying that the first processor is to execute the first set of instructions and that the second processor is to execute the second set of instructions.

8. The system of claim 1, wherein:
the sense operation is a verify operation of a program operation;
the third processor is configured to receive a command from a memory controller to perform the program operation; and
the third processor is configured to control a flow of the verify operation by specifying that the first processor is to execute the first set of instructions and that the second processor is to execute the second set of instructions.

9. The system of claim 1, further comprising:
first non-volatile memory that stores the first set of instructions;
second non-volatile memory that stores the second set of instructions;
third non-volatile memory that stores the third set of instructions; and an instruction updater configured to modify one or more of the first set of instructions in the first non-volatile memory, the second set of instructions in the second non-volatile memory, and the third set of instructions in the third non-volatile memory.

10. A method of sensing non-volatile memory cells, the method comprising:

sending control signals from a first processor to one or more voltage generators coupled to the non-volatile memory cells to control when a reference voltage is applied to a selected word line and when pass voltages are applied to unselected word lines during a present sensing phase of a sense operation of a group of the non-volatile memory cells, including executing first instructions on the first processor;

sending control signals from a second processor to a sensing circuit coupled to the non-volatile memory cells to test conditions of selected memory cells in response to the reference voltage applied to the selected word line during the present sensing phase, including executing second instructions on the second processor while the first processor executes the first instructions; and calculating a magnitude of the reference voltage for the selected word line for a sensing phase of the group that immediately follows the present sensing phase, including executing third instructions by a third processor while the first processor executes the first instructions and while the second processor executes the second instructions.

11. The method of claim 10, further comprising:

calculating, by the third processor, a magnitude of the reference voltage for the selected word line for the present sensing phase of the group; and providing the magnitude of the reference voltage for the selected word line for the present sensing phase from the third processor to a first voltage generator of the one or more voltage generators.

12. The method of claim 11, wherein sending the control signals from the first processor to control when the reference voltage is applied to the selected word line during the present sensing phase comprises sending the control signals from the first processor to the first voltage generator to control when the reference voltage for the present sensing phase is provided to the selected word line.

13. An apparatus comprising:

a main processor configured to execute a first set of instructions to calculate a magnitude for a reference voltage for a selected word line for each of n phases of a sense operation of a group of non-volatile memory cells connected to the selected word line and to unselected word lines, wherein n is an integer greater than 0; and a core processor configured to execute a second set of instructions to control when the reference voltage is applied to the selected word line and when pass voltages are applied to the unselected word lines during the n phases of the sense operation of the group, the main processor configured to execute the first set of instructions for phase n+1 while the core processor executes the second set of instructions for phase n.

14. The apparatus of claim 13, further comprising:

a sense processor configured to execute a third set of instructions to sense selected memory cells in the group in response to the reference voltage applied to the selected word line for the n phases, the sense processor configured to execute the third set of instructions for phase n while the core processor executes the second set of instructions for phase n and while the main processor executes the first set of instructions for phase n+1 of the sense operation.

15. The apparatus of claim 14, wherein the main processor is configured to control a flow of the sense operation by instructing the core processor to execute the second set of instructions and by instructing the sense processor to execute the third set of instructions.

16. The apparatus of claim 14, further comprising:

a sensing circuit configured to be connected to the non-volatile memory cells, wherein the sense processor is configured to issue control signals to the sensing circuit to test conditions of selected memory cells in response to the reference voltage applied to the selected word line during the n phases.

17. The apparatus of claim 14, wherein the sense processor is configured to execute the third set of instructions to sense the selected memory cells in response to a trigger signal from the core processor.

18. The apparatus of claim 13, further comprising:

a voltage generator configured to be connected to the non-volatile memory cells, wherein the core processor is configured to issue a control signal to the voltage generator to apply the reference voltage to the selected word line for phase n while the main processor provides the magnitude for the reference voltage for phase n to the voltage generator.

* * * * *